United States Patent
Kislov

(10) Patent No.: US 8,629,423 B1
(45) Date of Patent: Jan. 14, 2014

(54) NON-PLANAR METAL-INSULATOR-METAL TUNNELING DEVICE FOR SENSING AND/OR GENERATION OF ELECTROMAGNETIC RADIATION AT TERAHERTZ, INFRARED, AND OPTICAL FREQUENCIES AND TECHNOLOGY OF ITS PREPARATION

(76) Inventor: Nikolai Kislov, Tampa, FL (US)

( * ) Notice: Subject to any disclaimer, the term of this patent is extended or adjusted under 35 U.S.C. 154(b) by 352 days.

(21) Appl. No.: 12/455,967

(22) Filed: Jun. 10, 2009

Related U.S. Application Data

(60) Provisional application No. 61/098,693, filed on Sep. 19, 2008.

(51) Int. Cl.
*H01L 29/06* (2006.01)

(52) U.S. Cl.
USPC ...... 257/13; 257/443; 257/431; 257/E31.115; 438/48; 438/54; 438/69; 250/214.1; 250/370.01

(58) Field of Classification Search
USPC .................. 257/443, 428, 431, 293, E27.122, 257/E33.076, E31.115; 438/48, 54, 69; 250/214.1, 370.09, 370.01
See application file for complete search history.

(56) References Cited

U.S. PATENT DOCUMENTS

| | | | | |
|---|---|---|---|---|
| 4,466,008 A | * | 8/1984 | Beneking | 257/264 |
| 4,701,996 A | * | 10/1987 | Calviello | 438/173 |
| 8,022,451 B2 | * | 9/2011 | Nakamura | 257/293 |

\* cited by examiner

*Primary Examiner* — Mark A Laurenzi

(57) ABSTRACT

In the present invention, one or more inventive designs and techniques allow formation of high speed complementary metal oxide semiconductor (CMOS) process compatible tunneling devices that are formed on low dielectric loss sheet-substrates (such as silicon or germanium for infrared or quartz and sapphire for visible or near infrared) having the first and the second smooth planar surfaces and an intermediate surface in the form of a hole, or slit, or a side edge, which extends between and connects the first and second surfaces, so that deposited from opposite sides of the sheet-substrate the first metal layer followed by its oxidation or nanometer thickness tunneling dielectric coating and the second metal layer have an overlapped coupled area within the intermediate surface, thus forming a non-planar metal-insulator-metal (MIM) tunneling junction of low capacitance and high cut-off frequency, which is capable to operate at room temperature at terahertz, infrared, and even optical frequencies. Also included are methods of preparation of the non-planar MIM tunneling devices of the present invention as well as examples of practical applicability for manufacturing the devices for both reception and generation of terahertz, infrared, and optical radiation.

15 Claims, 22 Drawing Sheets

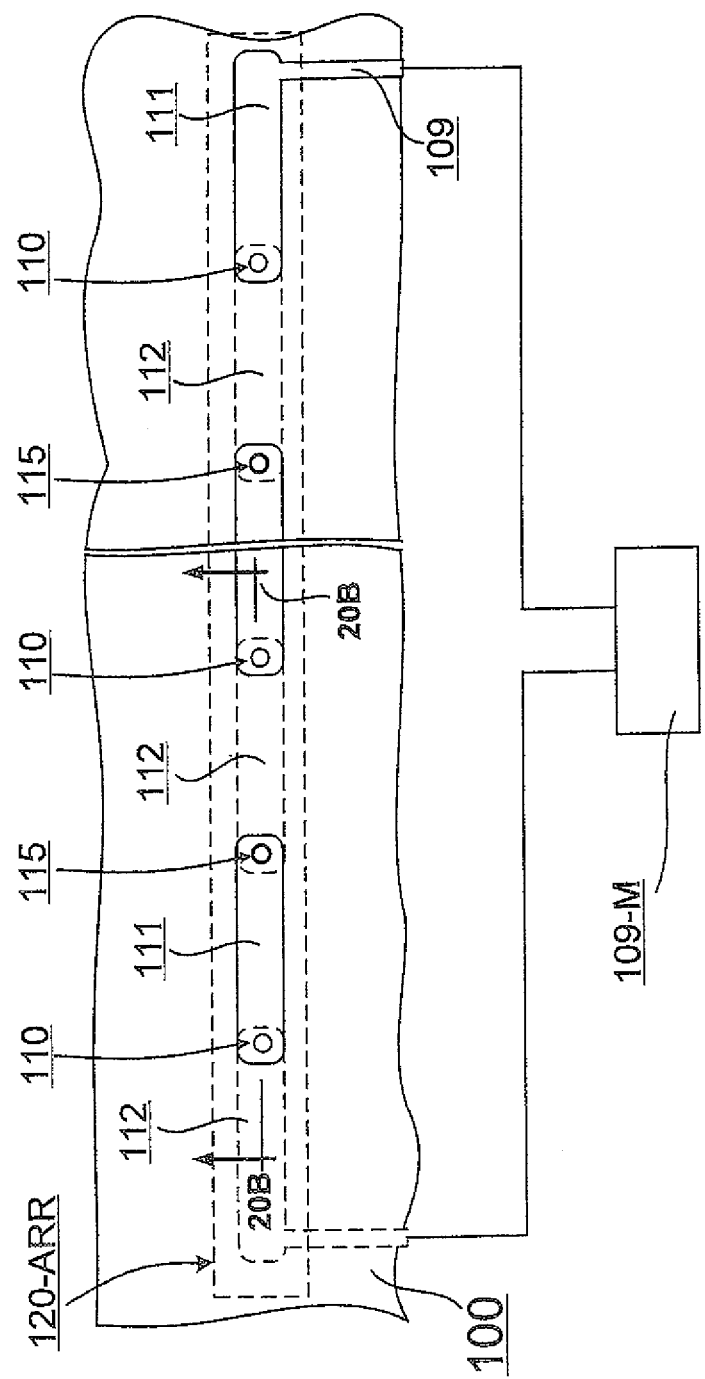

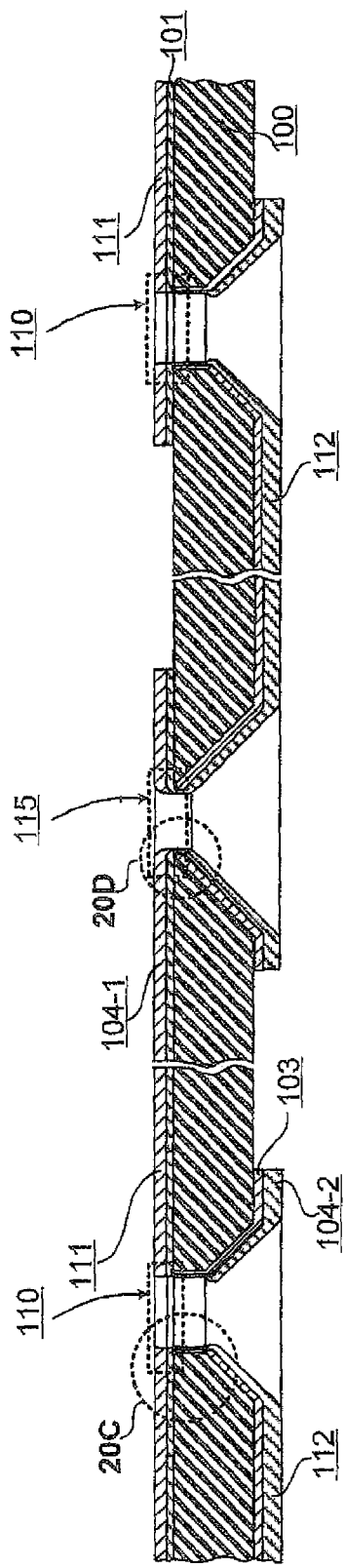
FIG. 20B
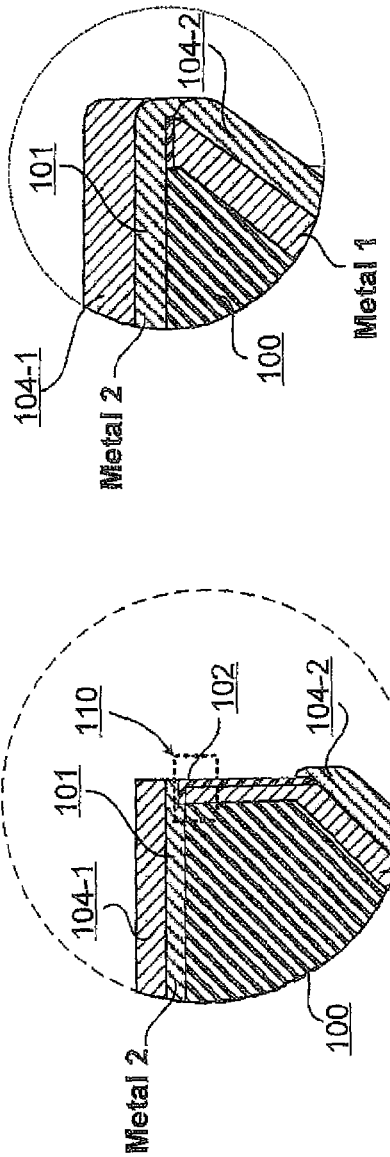
FIG. 20D
FIG. 20C

NON-PLANAR METAL-INSULATOR-METAL TUNNELING DEVICE FOR SENSING AND/OR GENERATION OF ELECTROMAGNETIC RADIATION AT TERAHERTZ, INFRARED, AND OPTICAL FREQUENCIES AND TECHNOLOGY OF ITS PREPARATION

RELATED APPLICATION

The present non-provisional application is based upon pending Provisional Application No. 61/098,693 filed Sep. 19, 2008, the subject matter of which is incorporated herein by reference.

GOVERNMENT SUPPORT

The present invention was made with support from The US Army Aviation & Missile Command under Contract Number W31P4!-08-C-0387. The United States Government retains certain rights to the invention.

BACKGROUND OF THE INVENTION

1. Field of the Invention

This invention relates to metal-insulator-metal tunneling devices/diodes (MIM TDs) and method of making such devices, and more specifically, to the design of tunneling junctions in a non-planar configuration designed for room temperature operation at sub millimeter, infrared, and optical frequencies.

2. Description of the Prior Art

A MIM TD is of significant interest because of its high speed of response. Its operation is based on the well known effect that if two metal electrodes are separated by a very thin insulating film or vacuum gap, current can flow between the two metal electrodes via tunneling [1]. In addition to the magnitude of asymmetry in the I-V characteristic, which defines rectification efficiency of the MIM TD, operation at the infrared and optical frequency region requires minimal parasitic shunt capacitance, series resistance, skin effect, thermal resistance and junction area. Moreover, the diode must provide stable characteristics and the structural configuration should be suitable for use in monolithic integrated circuits and arrays [2]. Because of the MIM TD's fast switching properties, it can be used in very high frequency applications. In fact, whisker-type or point-contact MIM diodes hold the current record of operation at 150 THz [3,4]. Whisker-type MIM TD structures have been successfully used as detectors and mixers at frequencies ranging from sub-millimeter to infrared wavelengths with reasonably good performance [5]. FIG. 1 shows a whisker MIM TD. It consists of metal substrate 101, tunneling oxide layer 102, and metal whisker 103. The major disadvantages of the whisker-type structure are their low mechanical stability as well as its incompatibility with integrated circuit system technology. Therefore, significant efforts have been made to integrate MIM TDs in planar configurations as those shown in FIG. 2. In the device shown in FIG. 2, a thin oxide layer 102 sandwiched between two crossing metal planar electrodes, namely metal strip 101 and metal strip 103 deposited on a dielectric substrate 100, creates a potential barrier that electrons can tunnel. However, this design exhibits a number of disadvantages such as high series resistance due to thin metal layers, high parasitic shunt capacitance, large junction areas in the order of $10^{-7}$ cm$^2$ to $10^{-8}$ cm$^2$ because of the lithography limitations, and an undesirably high skin resistance. All of these disadvantages limit the operating efficiency of these devices at frequencies in the order of 1 THz or higher. To overcome the disadvantages of the MIM TD designs described above, Calviello [2] proposed a quasi-planar MIM TD configuration shown in FIG. 3. In this prior art design configuration, the MIM tunneling junction 110 is formed in the area between peninsula-like projection of the metal layer 101 deposited on a dielectric substrate 100 and metal layer 103 through the thin dielectric layer 102. Here, metallization layer 104 made of 50-100 nm thick gold is used to reduce temperature dependence of the MIM TD structure. The tunneling device of the configuration shown in FIG. 3 is claimed to have a junction area in the $10^{-10}$ to $10^{-11}$ cm$^2$ range, which indicates the feasibility of the detection in 10 micron wavelength range [2]. This design still exhibits a number of limitations that include technical difficulties in low temperature fabrication of layer 105 (FIG. 3) having low dielectric loss and high thickness as well as still relatively high resistance due to extremely thin 101 metal layer in addition to difficulties in formation of an open and smooth edge of 101-1 electrode with a pinhole-free ultrathin tunneling dielectric layer 102, which are neighboring with a thick dielectric layer 105.

Another prior art processing technique of ultra-small tunneling junction fabrication is described by Ootuka et. al [7]. In this approach, silicon nitride membrane having small windows is used as a shadow mask to vacuum-deposit a metal film of fine structure onto a substrate. By means of double-angled evaporation, which consists in the deposition of a metal film with the same shape as the mask, oxidation of the metal layer, and finally, the deposition of the second metal layer of the same shape at a different angle, small tunnel-junctions are formed by overlapping the first and second metals through the thin dielectric layer. This method has important advantages over traditional photolithography processing, that is, the lift-off processes after vacuum deposition is not needed, and the plasma oxidation can be used for making tunneling barriers. Several limits of this method are: (1) there is a limitation in mask-alignment position setting; (2) there is broadening of the pattern during deposition mainly because of the finite gap between a mask and a substrate; and (3) a mask with large area is difficult to make because of the weakness of the membrane. The other traditional shadow-mask processes have suffered from a lack of robustness at dimensions below 75 nm, with significant run-to-run variability and poor process control. Current shadow-mask processes typically use a resist bilayer consisting of a thin poly-methylmethacrylate (PMMA) imaging layer on top of a thicker support layer of low-molecular-weight PMMA or PMMA/methacrylic acid copolymer, relying on the difference in sensitivity between the two resists to produce suitable undercut [8]. However, the long development time needed to create large undercut regions in the support layer can cause significant biasing of the imaging layer features, degrading process resolution which results in significant run-to-run variability and poor process control for the formation of the features below 75 nm.

There are various applications of MIM TDs. Particularly, they can be used for sensing terahertz/infrared/optical radiation using nonlinear characteristics of a tunneling device. Also, it can be used for the direct conversion of infrared and even visible light energy into electrical power by direct rectification of ultrahigh frequency electromagnetic wave. In fact, for conventional photovoltaic technologies, the solar energy conversion efficiency is fundamentally limited to approximately 30% because the photon energy that is significantly above the bandgap is lost (up to 24%). In contrast, an adequately designed antenna array in conjunction with an ideal non-linear MIM tunneling diode can efficiently absorb almost the entire solar spectrum, with the solar spectrum conversion efficiencies more than 85% [9]. Antenna-coupled infrared and optical detector consists of an antenna and a rectifier. It operates in the same way as a well known radio antenna at lower frequencies. In this detector, the electric field from an incident electromagnetic radiation source will induce a wave of accelerated electric charge in a conductor. Efficient collection of incident radiation is then dependent on resonance length scales and impedance matching of the antenna to the rectifier to prevent losses. In addition to a lot of attempts to use MIM tunneling junctions for detection of optical and infrared radiation [10], the non-linear electronic properties of MIM tunneling junctions is a great deal of practical interest to the spontaneous light emission from non-equilibrium MIM tunneling junction cause by photon-assisted tunneling of electrons [11]. The most important features of photon-assisted electron tunneling are the possibility of modulating the light frequency by varying the operating voltage [12].

What is needed in the art are simplified designs and methods of fabricating MIM TDs that the ability to produce a very small junction area MIM TD that are free from the described above limitations. The present invention satisfies those needs.

SUMMARY OF THE INVENTION

In the present invention, one or more inventive designs and techniques allow formation of high speed complementary metal oxide semiconductor (CMOS) process compatible tunneling devices that are formed on low dielectric loss sheet material (such as silicon or germanium for infrared or quartz and sapphire for visible or near infrared) having the first and the second sheet side surfaces and an intermediate surface in the form of a hole, or slit, or a sheet edge, which extends between and connects the first and second sheet-substrate surfaces, so that deposited from opposite sides of the sheet-substrate the first metal layer followed by its oxidation or nanometer thickness tunneling dielectric coating and the second metal layer have an overlapped coupled area within the intermediate surface, thus forming a non-planar MIM tunneling junction of low capacitance and high cut-off frequency. The junction area of the MIM TD is controlled by both the intermediate surface size and shape and the method or methods combination of metal deposition and the geometry of deposition.

The major advantages of the present invention design and technology of its preparation can be enumerated as following:
1. Compatibility with CMOS technology
2. Low cost of production because of lack of expensive nanolithography processes
3. Higher quality of metal and insulating layers because of lack of nanolithography processing
4. Low electrical resistance of the MIM TD structure because of the direct electrical connection of the MIM TD with antenna
5. Possibility to design MIM TD array
6. Negligible parasitic shunt capacitance because of non-planar configuration of the MIM tunneling junction
7. Lack of dielectric coating within the vicinity of the MIM tunneling junction resulted in minimizing energy loss due to absorption through the dielectric material
8. Providing stable characteristics and the structural configuration that suitable for use in monolithic integrated circuits and arrays.

These MIM TDs of present invention or their arrays can be used industrially particularly for manufacturing of the devices for both converting light power into electric power and reception of terahertz, infrared, and optical radiation as well as for terahertz, infrared, and optical radiation generation by applying an external current.

Further aspects and advantages of this invention will be evident from the following detailed description of the ten preferred embodiments as well as four additional embodiments related to the industrial applicability, which are to be read in connection with the accompanying drawings.

BRIEF DESCRIPTION OF THE DRAWINGS

FIG. 20A is a diagrammatic illustration of a top view of a dipole antenna array designed in accordance with the present invention, shown here to illustrate the dipole antenna array configuration wherein the MIM tunneling junction of each dipole antenna element of the antenna array are connected in series through the antenna arms by using non-planar metal interconnectors.

FIG. 20B is a diagrammatic illustration of a cross-sectional side view 20A-20A from FIG. 20A.

FIG. 20C is a diagrammatic illustration of a cross-sectional view magnified view of the non-planar MIM TD FIG. 20B.

FIG. 20D is a diagrammatic illustration of a cross-sectional side magnified view of the non-planar interconnector from FIG. 20B.

DESCRIPTION OF THE PREFERRED EMBODIMENT

Figure 1:
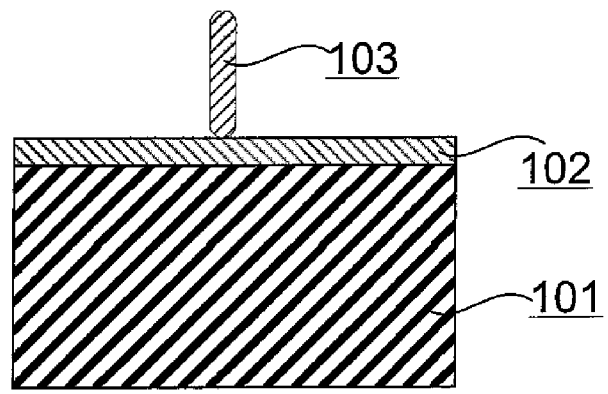
FIG. 1 is a sectional view of a prior art point contact MIM tunneling device.
Figure 2:
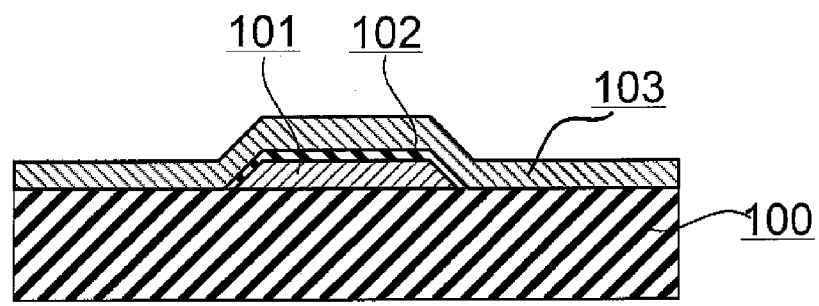
FIG. 2 is a cross sectional view of a prior art MIM tunneling device having a cross junction configuration.
Figure 3:
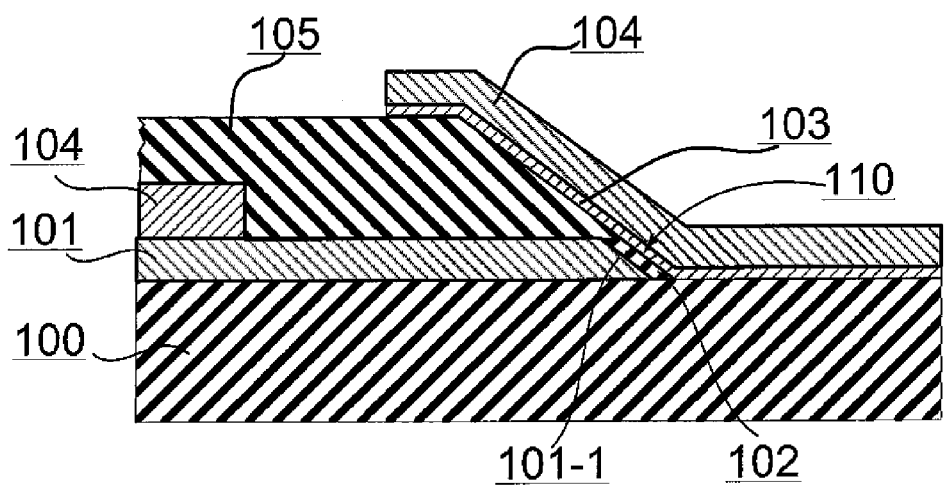
FIG. 3 is a perspective view of a prior art quasi-planar MIM TD configuration having low tunneling junction area.

In the following description of the preferred embodiment, reference is made to accompanying drawings that form a part hereof, and in which is shown by way of illustration a specific embodiment in which the invention may be practiced. It is to be understood that other embodiments may be utilized and structural changes may be made without departing from the scope of the present invention.

Overview

The major design goal of the present invention was to develop an MIM TD operating in the terahertz to optical wavelengths region. The development of such a structure requires the MIM TD to have the following characteristics:
  (a) an oxide thickness in the 1 to 5 nm range
  (b) a junction area ranging between $2 \times 10^{-10}$ to $10^{-11}$ cm$^2$
  (c) negligible shunt capacitance ranging between $5 \times 10^{-17}$ F for infrared and $3 \times 10^{-18}$ F $10^{-17}$ F for optical frequencies.
  (d) compatibility with CMOS technology (using conventional photolithography processing and available in the industry metal and dielectric layer coating techniques).

One or more difficulties associated with manufacturing a sensor device having a MIM TD structure having satisfactory performance are: an insufficiently small junction area, too high series resistance at infrared and optical frequencies, and poor oxide and metal layers quality because of lithography/microfabrication difficulties at nanoscale as well as high parasitic shunt capacitance and a large thermal component of the signal because of disadvantages of prior art devices designs. Therefore, it would be desirable to provide a design of the MIM TD device and technology of its fabrication, which are not restricted by lithographic and sub-micron processing techniques. This invention provides a simple and convenient means for substrate configuration, sequence of metal and dielectric layers formation and their geometry for both MIM tunneling junctions and their assemblies for detection and generation of electromagnetic radiation at terahertz, infrared, and optical frequencies.

The formation of metal and dielectric layers as well as their patterning is a key aspect in the micro- and nanoelectronic processing. Nanopatterning of dielectric and semiconductor layers may consist in the following steps. The process starts with micro-scale patterning using positive or negative resists on topside of the layer of interest by means of conventional photolithography and/or e-beam lithography. The micro-scale resist pattern is transferred into the layer by subsequent etching using wet or dry etching. In the same way, the backside patterns are etched using patterned backside dielectric as an etch mask during the backside etching of the silicon substrate in order to release the silicon membrane having a stop etch or dielectric membrane [13]. Other techniques such a focused ion-beam milling or laser evaporation can be used for patterning a substrate.

Semiconductor metallization techniques have historically utilized dry process techniques such as physical vapor deposition. All these techniques utilize the same fundamental steps to develop a coating: (1) vapor phase generation from coating material stock by evaporation, sputtering, arc vaporization or chemical vapors and gases, (2) the transfer of the vapor phase from source to substrate, and (3) deposition and film growth on the substrate.

Physical (resistive or electron-beam) evaporation (PVD) is predominantly a high vacuum neutral atom emission processes. Since the evaporated atoms are "directional from the source", it is not possible to redirect their trajectory once they are ejected from the vapor source. No film growth can occur in shadowed locations. This method is applicable where deposition on flat surfaces is needed. However, it creates problems for deposition into high aspect ratio features. This method is classified as non-lateral deposition method in the following consideration. Other not mentioned here methods that have inhibited lateral deposition properties may be added to this class without modification of the definition.

Sputtering is a deposition from a spatially distributed source. For planar magnetron sputtering, sidewall coating is almost equal to surface coating because the substrate is immersed in the plasma. The rf-based inductively coupled PVD (I-PVD) systems use conventional magnetron sources, running independently from the dense, inductively coupled rf plasma, which is used for the metal ionization. This method is considered to be the most suitable for metal deposition within high aspect ratio (ratio of the height to the width) holes or grooves. Lateral deposition occurs as a result of high surface mobility of atoms at the surface and high directionality of depositing atoms arriving from the sputter source. Plasma Enhanced Chemical Vapor Deposition (PECVD) is another process that can be used to deposit thin films from a gas state (vapor) to a solid state on non-planar surface of the substrate. In this process, homogenous reaction between the reactant gases is initiated by the electrons produced in the plasma. The ions are accelerated towards the electrodes due to the self bias voltage between the plasma and the electrode. These energetic ions bombard the surface and because of indirect diffuse re-emission as well as resputtering of deposited material and its redeposition, the deposition on side walls of holes, slits, and cavities may occur [14]. The fabrication of the MIM TD requires using high quality pin-hole free ultrathin dielectric layers. Atomic layer deposition (ALD) is the most suitable process for this purpose. This technique is based on the sequential use of self-terminating gas-solid reactions [15]. By its nature, ALD provides control of the film thickness with nanometer precision. Another unique feature of ALD is the conformal growth of films on substrates of virtually any shape, namely, deposition on side walls of holes, slits, and cavities.

The described above planar magnetron sputtering, I-PVD with a high collimation angle, PECVD, and ALD methods are classified as lateral deposition methods in the following consideration. Other not mentioned here methods that reveal lateral deposition properties may be added to this class without modification of the definition. Particularly, the deposition using e-beam or resistive heater evaporators in the vacuum chambers equipped with a planetary systems results also in the step or side wall coverage on the substrate [16].

Figure 4A:
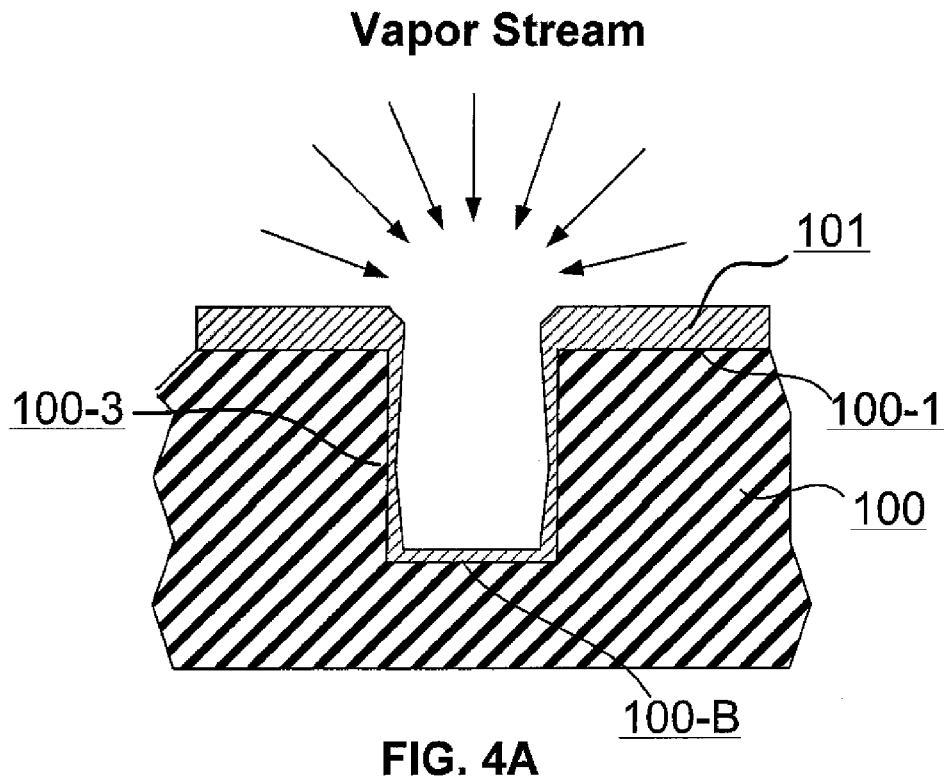
FIG. 4A shows an effect of lateral deposition of metal on sidewalls of a hole using the lateral method of deposition.
Figure 4B:
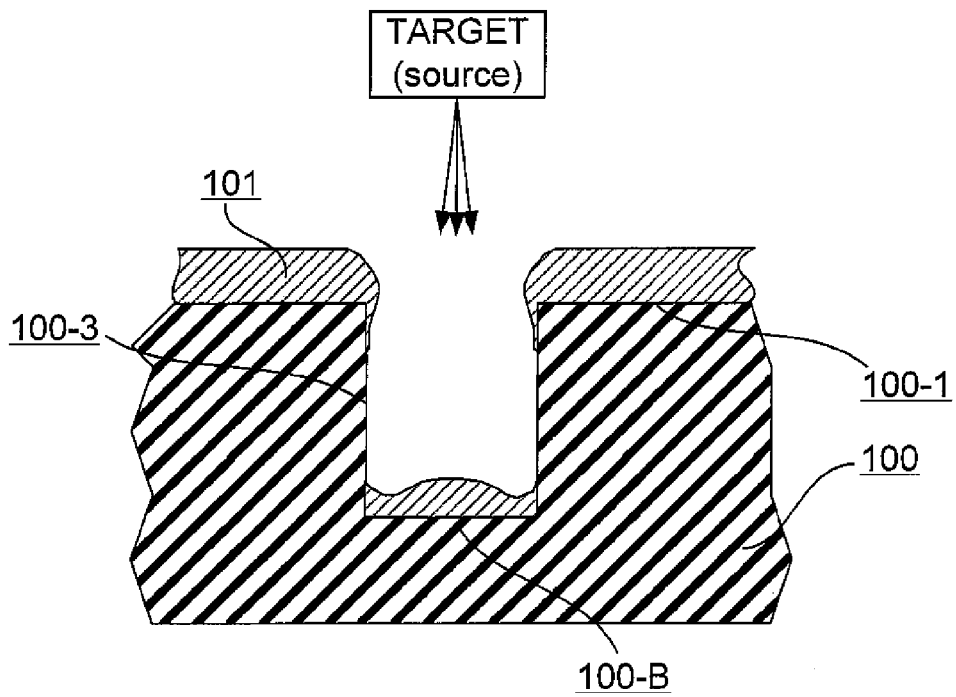
FIG. 4B shows a profile of the deposition in and around the hole using ion assisted physical vapor deposition (I-PVD) with a very low incidence collimation angle.

FIG. 4A shows a deposition profile after applying a lateral method of deposition (particularly by sputtering) of the metal 101 on the substrate 100 having a hole. The net effect is that both the top planar surface 100-1 and the bottom and side wall of the hole 100-3 are coated with the continuous metal layer. This effect is normally used for filling trenches and vials [17]. However, using I-PVD with a very low incidence collimation angle (less than 5 degree) results in diminishing lateral deposition as it is shown in FIG. 4B. At these conditions, the metal is deposited mostly on the top planar surface 100-1 and the bottom surface 100-B of the hole [18].

The geometrical size of the optical/infrared detectors is in the order of the wavelength, which requires using fabrication techniques with micro- and nanoscale spatial resolution. In addition, in these designs, the optical/electromagnetic properties of substrates as well as their thickness plays a crucial role in the device performance. Moreover, for a planar antenna, the thickness of the substrate affects the surface wave $TE_1$ mode cut-off frequency and in the case of a silicon substrate the substrate thickness should be less than 400 nm [19]. Therefore, an ultrathin silicon membrane is required for fabrication of a detector operating at 28 THz. Thin silicon membranes suspended by a substrate, such as a silicon substrate, have been used in different fields including but not limiting to x-ray lithography, for specialty electronic devices such as air bridges in fast transistors, and for a bolometer applications. Among the methods of forming silicon membranes is a method in which a silicon stop layer is formed on a silicon substrate. Silicon dioxide, silicon nitride, or diamond layers may also be formed on the substrate, which also play a role of a stop layer. A portion of the silicon substrate is then removed by etching, and etching stops enriching the stop etch layer [20].

TECHNICAL DESCRIPTION

Although the afore described prior art devices and fabrication processes have been made over the past decades, the Applicant is unaware of presently available MIM TDs having cut-off frequency 28 THz or higher, which can be fabricated without limitations intrinsic to lithographic and sub-micron processing techniques. In addition, even though planar RF or planar magnetron sputtering has very good step coverage and is widely used for sidewall coating to make interlayer connections through a hole or groove, the Applicant is unaware of presently available a MIM tunneling junction design having a non-planar configuration and is being located within the hole or groove sidewall.

The present invention achieves the previously mentioned design objectives and overcomes the above mentioned disadvantages in prior art designs and methods by providing a non-planar configuration of the MIM tunneling junction presented in FIG. 7 through FIG. 15 and MIM TD array in FIG. 16, and developing methods of their fabrication as well as describing possible application of MIM TDs for infrared and optical sensing and light generation, which are illustrated in FIG. 17 through FIG. 20.

Figure 5A:
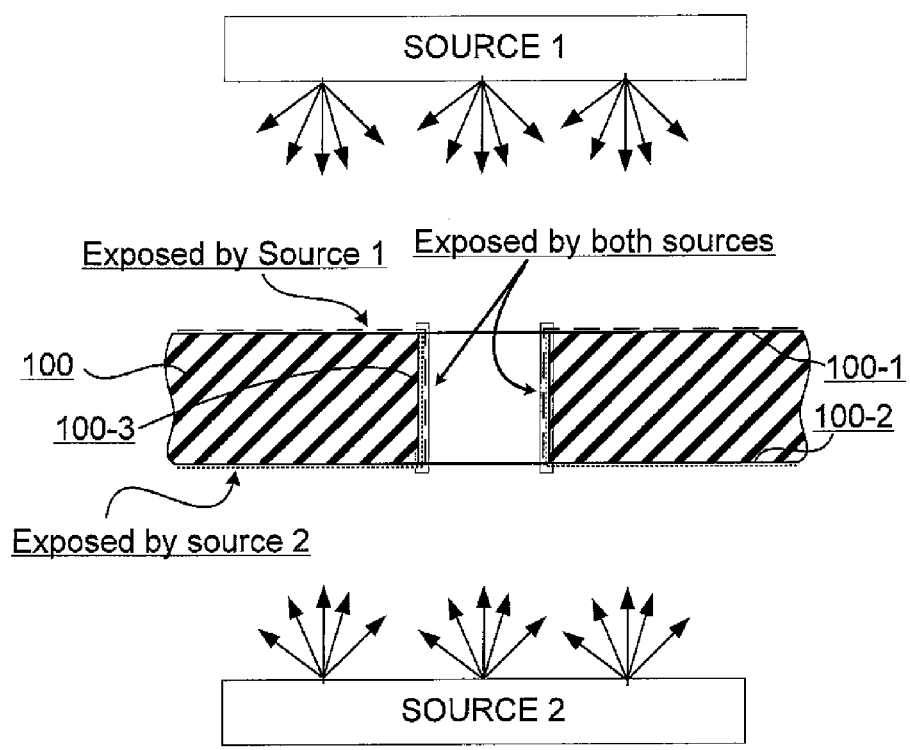
FIG. 5A demonstrates the mutual "visibility" or exposition of the entire intermediate surface 100-3 in the form of a hole or slit when lateral sources of deposition are used from both the first (Source 1) and second (Source 2) sides of the substrate.
Figure 5B:
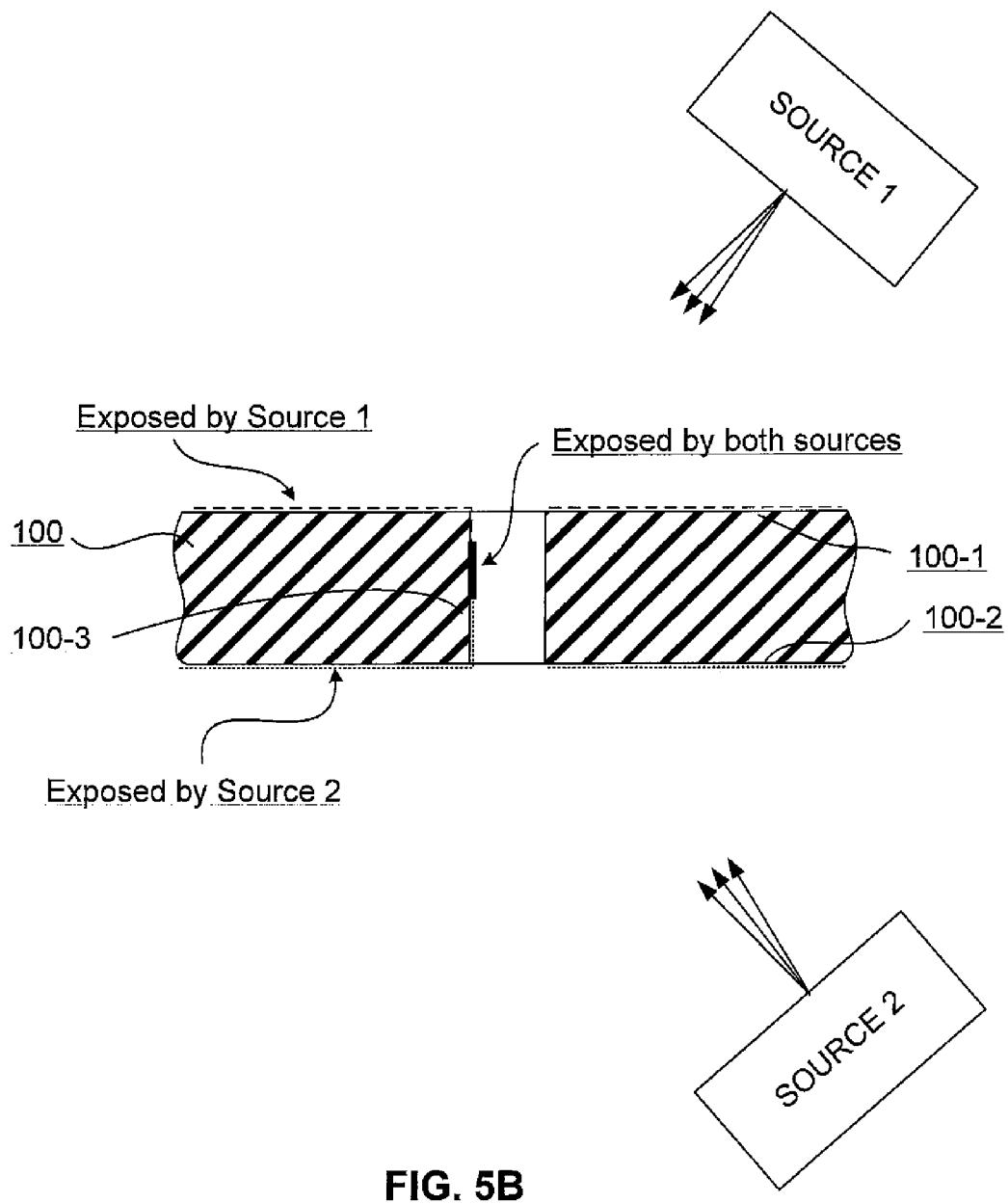
FIG. 5B shows location of the overlapped area on a side wall of the hole or slit, which is exposed by both first (Source 1) and second (Source 2) non-lateral particulate sources with angled incidence of the flux of particulate materials.
Figure 5C:
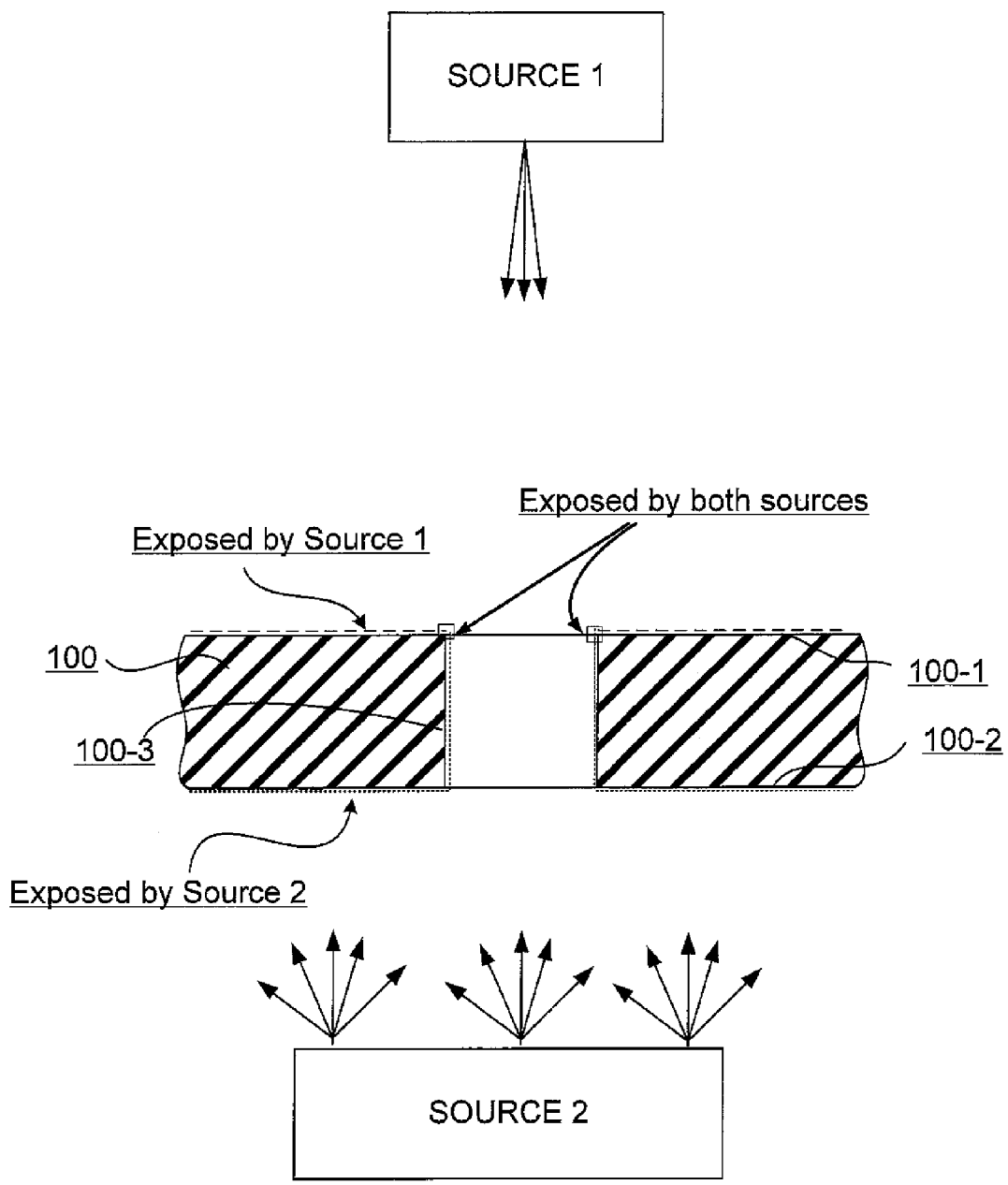
FIG. 5C demonstrates the schematic of deposition where Source 1 is a non-lateral source with normal incidence of the flux of particulate material and Source 2 is lateral source located from the opposite side of the substrate indicating that only an area along the line of intersection the side wall and the first planar surface is exposed by both sources.
Figure 5D:
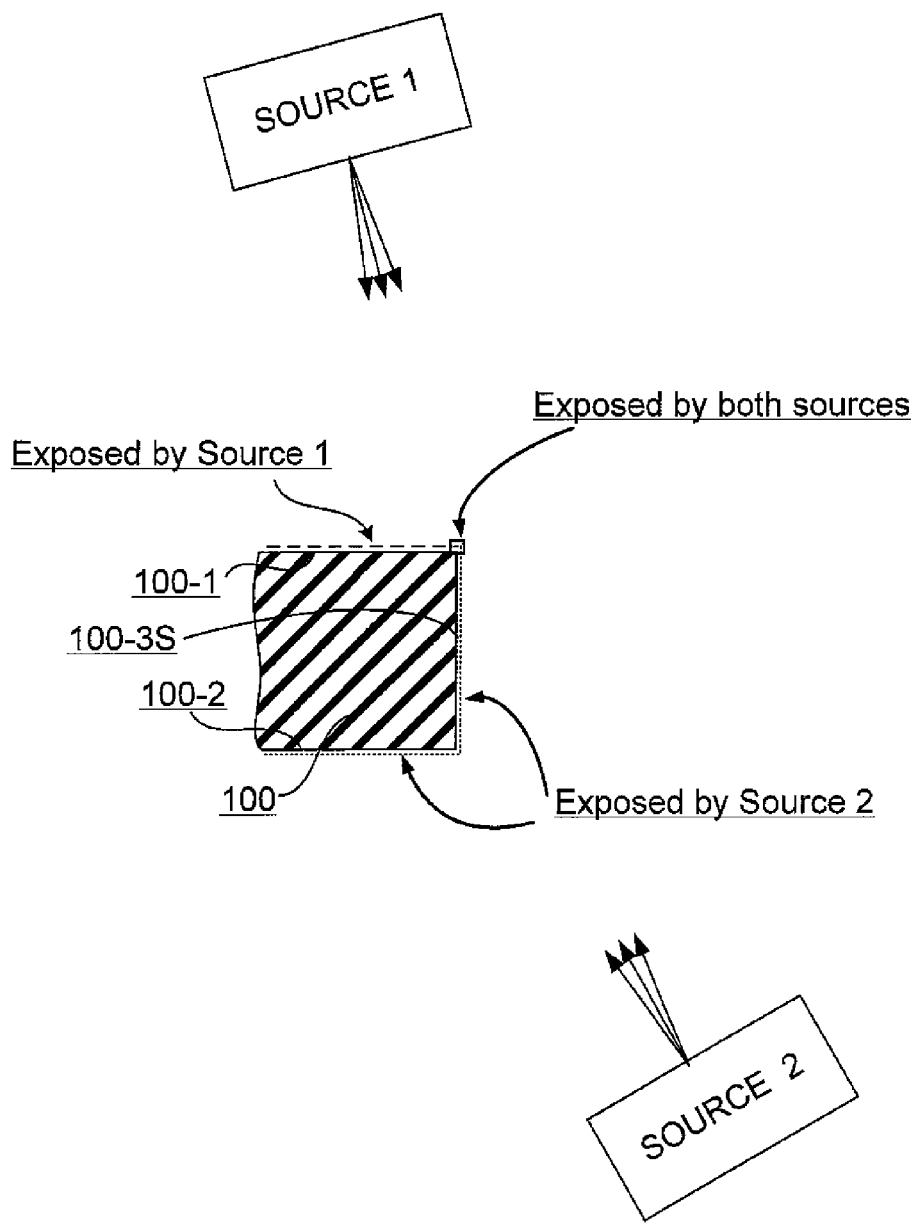
FIG. 5D demonstrates a schematic of deposition where Source 1 and Source 2 are non-lateral sources of particulate material, where Source 1 directs particulate material flux on the planar surface 100-1 of the substrate, and Source 2 directs particulate material flux on both a second planar 100-2 and edge 100-3S surfaces of the substrate indicating that only an area along the line of intersection the side wall and the first planar surface is exposed by both sources.
Figure 6A:
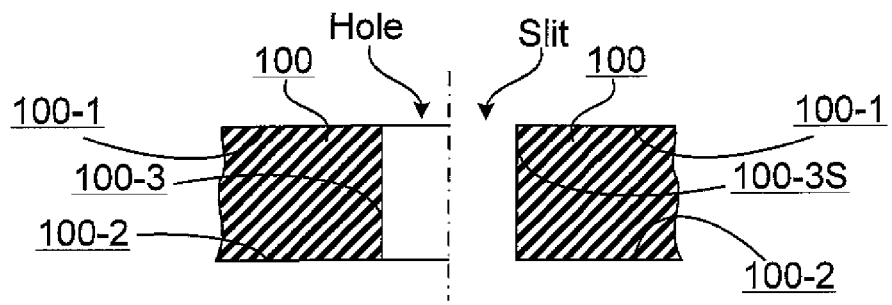
FIG. 6A is a sectional side view of the sheet-substrate 100 having the intermediate surface formed by a hole of cylindrical/prismatic shape 100-3 (left from the symmetry line) or by a straight rectangular slit (right from the symmetry line).
Figure 6B:
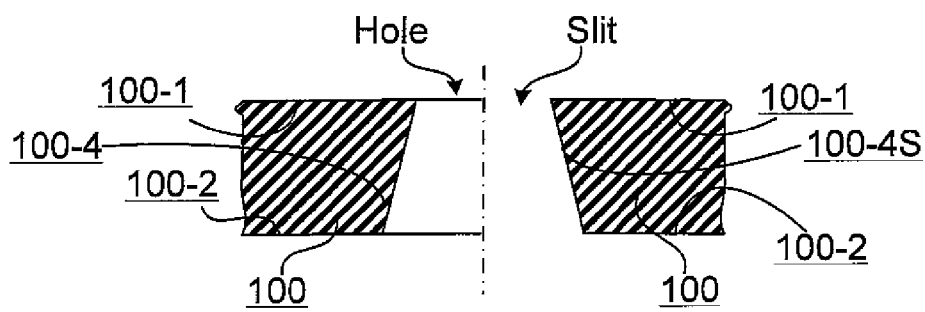
FIG. 6B is a sectional side view of the sheet-substrate 100 having the intermediate surface formed by a hole of conical/pyramidal shape 100-4 (left from the symmetry line) or by an angled slit (right from the symmetry line).
Figure 6C:
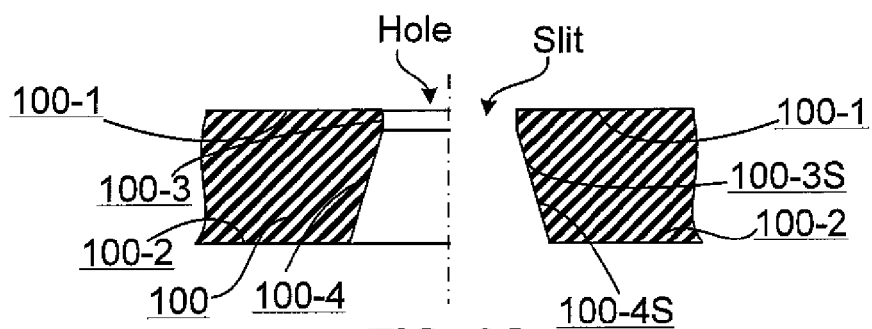
FIG. 6C is a sectional side view of the sheet-substrate 100 having the intermediate surface formed by a combination of conical/pyramidal surface 104-4 (left from the symmetry line) or angled slit (right from the symmetry line) on one side (bottom) and a cylindrical/prismatic surface 100-3 (left from the symmetry line) or by a straight rectangular slit (right from the symmetry line) on the other side (top).
Figure 6D:
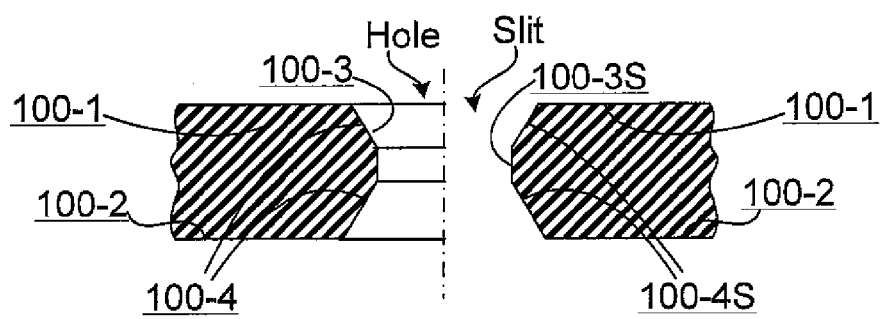
FIG. 6D is a sectional side view of the sheet-substrate 100 having the intermediate surface formed by a combination of conical/pyramidal surfaces 104-4 (left from the symmetry line) or angled slit (right from the symmetry line) on both first 100-1 and second 100-2 sides of the sheet-substrate 100 and a cylindrical/prismatic surface 100-3 (left from the symmetry line) or by a straight rectangular slit (right from the symmetry line) in the middle part of the hole or slit, respectively.

In these designs, as shown in FIGS. 5A-5D, a planar sheet-substrate 100 made of low dielectric loss sheet material such as silicon or germanium for infrared or quartz and sapphire for visible or near infrared having the first 100-1 and the second 100-2 sheet side constituting first and second sheet surfaces and an intermediate surface 100-3 in the form of a hole, or slit, or a sheet-substrate edge, which extends between and connects the first 100-1 and second 100-2 surfaces. The intermediate surface is constructed by such a way that it or its portion is exposed by the sources of particulate material generation located from both the first and the second sides of the sheet-substrate. The location and size of the mutually exposed from the both particulate material sources depend of both the shape of the intermediate surface and the methods and geometry of the deposition. FIG. 5A demonstrates the mutual "visibility" or exposition of the entire intermediate surface 100-3 in the form of a hole or slit when lateral sources of deposition are used from both the first (Source 1) and second (Source 2) sides of the substrate. FIG. 5B shows location of the area on a side wall of the hole or slit, which is exposed by both first (Source 1) and second (Source 2) non-lateral particulate sources; each of them exposes both a planar and a hole/slit side wall. In this case, the width and the position of the overlapped exposed strip depend of the geometry of deposition as well as the aspect ratio of the hole/slit. Particularly, if the vapor flux on the side wall of a hole/slit is not shaded by the opposite side of the hole/slit the overlapped or mutually exposed from both sources area covers the side wall completely along the substrate thickness. FIG. 5C demonstrates a schematic of deposition when the side wall of the hole/slit is not "visible" or exposed from the non-lateral evaporation Source 1 when the incident flux of evaporated material is parallel to the intermediate surface of the hole/slit. However, the internal side surface of the first layer deposited from Source 1 on the surface 100-1, which is faced to the hole/slit, will be exposed by lateral particulate Source 2 located from the opposite side 100-2 of the sheet-substrate, thus creating an overlapped area within only the thickness of the first deposited layer. FIG. 5D demonstrates a schematic of deposition where Source 1 and Source 2 are non-lateral sources of particulate material. In this schematic, Source 1 directs particulate material flux on the planar surface 100-1 of the substrate, and Source 2 directs particulate material flux on both a second planar 100-2 and edge 100-3S surfaces of the substrate; only the area along the line of intersection of planar and edge surfaces of the substrate is exposed by both Source 1 and Source 2. The intermediate surfaces formed by a hole/slit are distinguished by four basic hole/slit shapes shown in FIGS. 6 A-D. In these figures, a part of the schematic located on the left from the symmetry line represents a hole design and the right part represents a slit design. To distinguish the representation of the configurations, the slit is considered to be of unlimited length, which is resulted in vanishing of some projection lines in the right parts of the schematics.

a) Cylindrical/prismatic 100-3 (left from the symmetry line) and straight rectangular 100-3S (right from the symmetry line) intermediate surfaces shown in FIG. 6A, which extend between and connect the first 100-1 and the second 100-2 planar surfaces.
  b) Conical/pyramidal 100-4 (left from the symmetry line) and angled slit 100-4S (right from the symmetry line) intermediate surfaces shown in FIG. 6B, which extend between and connect the first 100-1 and the second 100-2 planar surfaces.
  c) A combination of conical/pyramidal surface 104-4 from one side and a cylindrical/prismatic surface 100-3 (left from the symmetry line) and angled 104-4S and straight rectangular 100-3S (right from the symmetry line) intermediate surfaces shown in FIG. 6C, which extend between and connect the first 100-1 and the second 100-2 planar surfaces. The conical/pyramidal shape of the intermediate surface is preferable over the cylindrical/prismatic when lower aspect ratio for the hole is needed to allow formation of metal layer of higher thickness on lateral surfaces. However, as it will be seen from the further analysis, the cylindrical/prismatic portion of the hole is needed to prevent potential shorts between the MIM tunnel junction metal electrodes.
  d) A combination of conical/pyramidal surfaces 104-4 from both first 100-1 and second 100-2 sides of the sheet-substrate 100 (left from the symmetry line) and a combination of angled surfaces 104-4S from both first 100-1 and second 100-2 sides of the sheet-substrate 100 a rectangular 100-3S in a middle portion of the slit (right from the symmetry line) intermediate surfaces shown in FIG. 6D, which extend between and connect the first 100-1 and the second 100-2 planar surfaces.

In the following consideration, taking into account that the described above schematics (FIGS. 5A-5D) and basic shapes of the substrate (FIGS. 6A-6D) should be considered as illustrative and not restrictive, and the invention aspects are not to be limited to the basic schematics and shapes described above, the most attention is taken to the analysis of a structural configurations of the MIM TD with the intermediate surface formed by slits and edges having rectangular cross-section and holes constructed by a combination of cylindrical/prismatic and conical/pyramidal surfaces.

It is preferable that both first 100-1 and second 100-2 planar surfaces as well as intermediate cylindrical/prismatic 100-3 and conical/pyramidal 100-4 surfaces are smooth to allow formation of continuous thin metal and dielectric layers on them.

It is also preferable that the intermediate surface is formed by holes and slits having aspect ratio 5 or less to allow lateral deposition of metal and dielectric layers on their internal walls. In order to mix different radiation sources at optical frequencies, MIM TDs must have a fast response time. It is well known from quantum mechanics basics that tunneling is not a limiting factor in achieving a sufficiently fast response. In fact, the circuit speed limit of the diode determines the response time. In the equivalent circuit, the diode is described by a junction capacitance $C_{MIMTD}$ in parallel with an internal nonlinear resistance $R_{MIMTD}(V)$, which are connected in series with the external resistance, $R_E$, of the MIM TD connections and antenna radiation resistance, $R_A$. In this case, the cut-off frequency of the circuitry is defined as [21]:

$$\gamma_c = (2\pi(R_A + R_E)C_{MIMTD})^{-1} \quad (1)$$

Here $$C_{MIMTD} = \epsilon_{TD}\epsilon_0 A_{MIMTD}/h_{TD}, \quad (2)$$

where $\epsilon_{TD}$ is the dielectric constant of a tunneling dielectric, $h_{TD}$ is the tunneling oxide thickness, $A_{MIMTD}$ is the junction area that depends of the geometry and layers thickness and can be calculated using one of the equations from for corresponding MIM tunneling junction configuration, and $\epsilon_{TD}$ is the dielectric constant of the tunneling dielectric. The series resistance of the MIM TD, $R_E$, depends of the critical conductor metal layers resistivity, $\rho$, and its characteristic geometrical parameters, namely, length, l, and cross-section, A, which also are dependent of the MIM tunneling junction configuration. It can be estimated as $$R_E = \rho \cdot l/A, \quad (3)$$

and will be specified for each of the following exemplary embodiments.

Figure 7A:
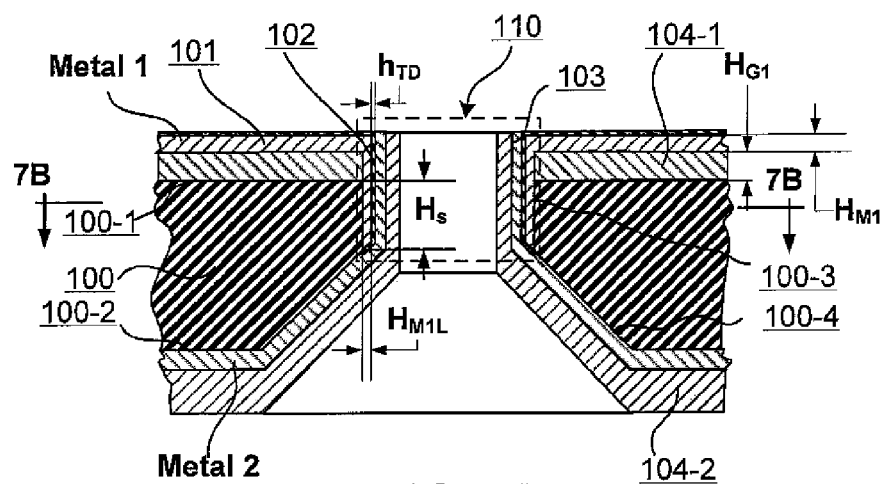
FIG. 7A is a diagrammatic illustration of a cross-sectional side view of a co-axial MIM TD designed in accordance with the present invention, shown here to illustrate the MIM TD layers configuration where the MIM tunneling junction is located within the cylindrical/prismatic portion of the hole.
Figure 7B:
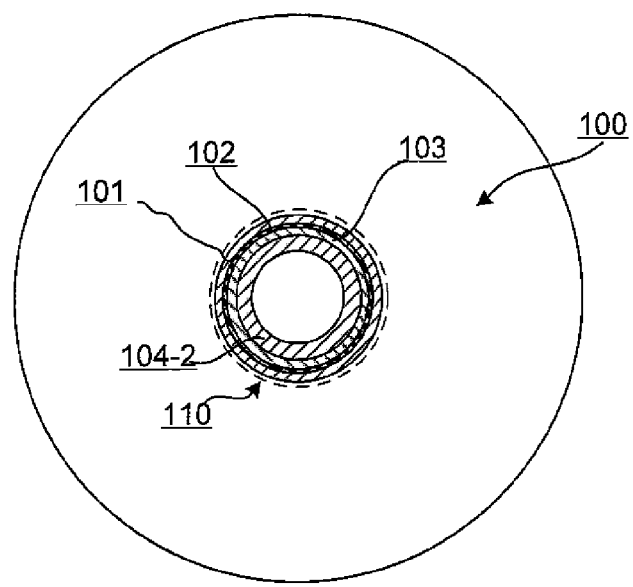
FIG. 7B is a diagrammatic illustration of a cross-sectional top view 7A-7A from FIG. 7A.

Turning now to FIG. 7A (side view) and FIG. 7B (top view), wherein like reference numbers are used to refer to like components, an exemplary embodiment of an MIM tunneling junction with reduced series electrical and thermal resistance of the present invention are illustrated. The geometry of the formation of the MIM TD shown in FIG. 7A is similar to the schematics shown by FIG. 5A. In this design, gold or another high conductivity metallization layer 104-1 is deposited over the first sheet-substrate surface by a non-lateral method of deposition with normal incidence of vapor flux, which decreases essentially both high series electrical resistance and thermal resistance of the MIM tunneling junction. This initial step is followed by the first functional Metal 1 layer 101 deposition using a lateral method of deposition, which coats completely the top and side surfaces of the first high conductivity metal as well as the cylindrical surface 100-3 of the intermediate surface of the substrate 100. The next steps include the first functional Metal 1 oxidation and/or its coating with a nanometer thickness tunneling dielectric layer 102 using particularly the ALD method. The second functional Metal 2 layer is deposited by a lateral method of deposition from the opposite side of the substrate on the second planar surface 100-2 and conical/pyramidal surface 100-4 of the substrate 100. Thus, the overlapped through the tunneling dielectric cylindrical/prismatic area of the first and the second metals forms a non-planar co-axial MIM tunneling junction 110. In this configuration, the MIM tunneling junction area has the width that includes the thickness of the metallization layer 104-1, $H_{G1}$, and the first working Metal 1 both planar, $H_{M1}$, and lateral, $H_{M1L}$, as well as the height of the cylindrical/prismatic portion of the substrate hole, $H_S$, and the length of the cylindrical/prismatic hole perimeter, P. The MIM tunneling junction area is estimated as $$A_{MIMTD} = (H_{G1} + H_{M1} + H_S + H_{M1L}) \cdot P, \quad (4)$$

and its capacitance is calculated using Equation 2. To further reduce the MIM TD series electrical resistance and thermal resistance, gold or another high conductivity metallization layer 104-2 is deposited over the Metal 2 layer 103 by a lateral method of deposition. The design described above as well as the following MIM TD designs described in FIGS. 8-9, are distinguished from the prototype designs by position of metallization layers that are made of gold, platinum or other high thermal and electrical conductivity and low chemical reactivity metals typically ranging in thickness from 50 to 1000 nm over functional metals, both Metal 1 and Metal 2 that typically have thickness ranging between 5 and 100 nm, immediately next to the MIM tunneling junction area by automatic layer adjustment without involvement additional masking alignment procedures, which allows to significantly reduce both electrical and thermal resistance of the MIM tunneling junction. Finally, by neglecting MIM TD external resistance, $R_E$, and substitution of the $C_{MIMTD}$ and the real part of the embedding antenna circuit impedance, $R_A$, into Equation 1, the cut-off frequency of the MIM tunneling junction can be estimated. For the described above method of formation of the MIM tunneling junction of nanometer scale, submicron lithography is not required.

Figure 8A:
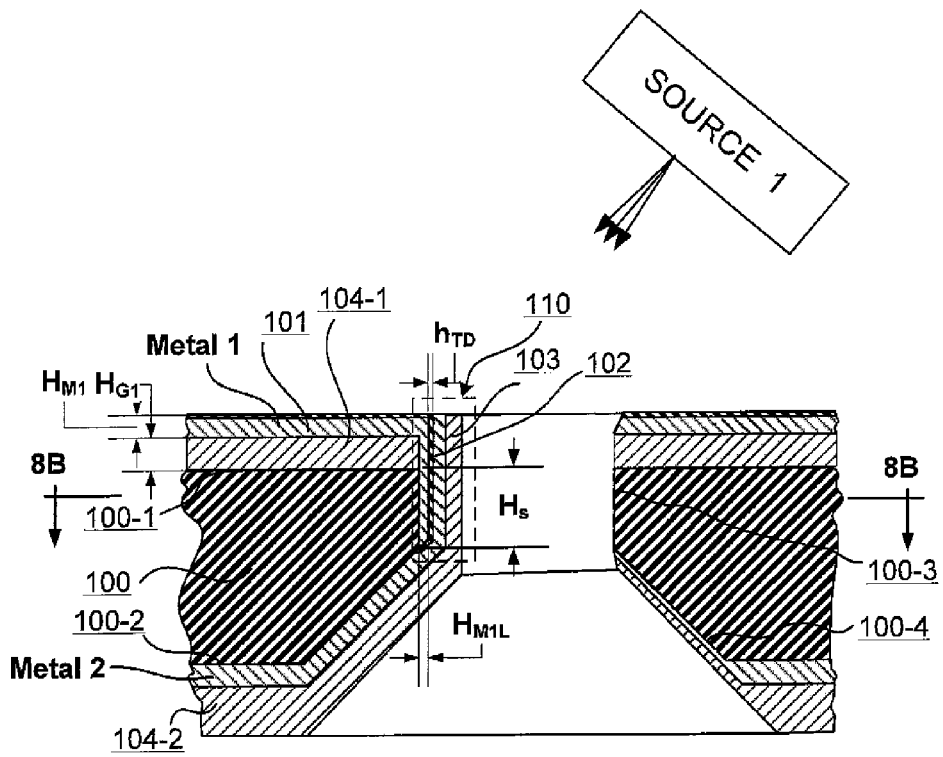
FIG. 8A is a diagrammatic illustration of a cross-sectional side view of a MIM TD designed in accordance with the present invention, shown here to illustrate the MIM TD layers configuration where the MIM tunneling junction is located on one side of the wall because of using non-lateral angled deposition sources.
Figure 8B:
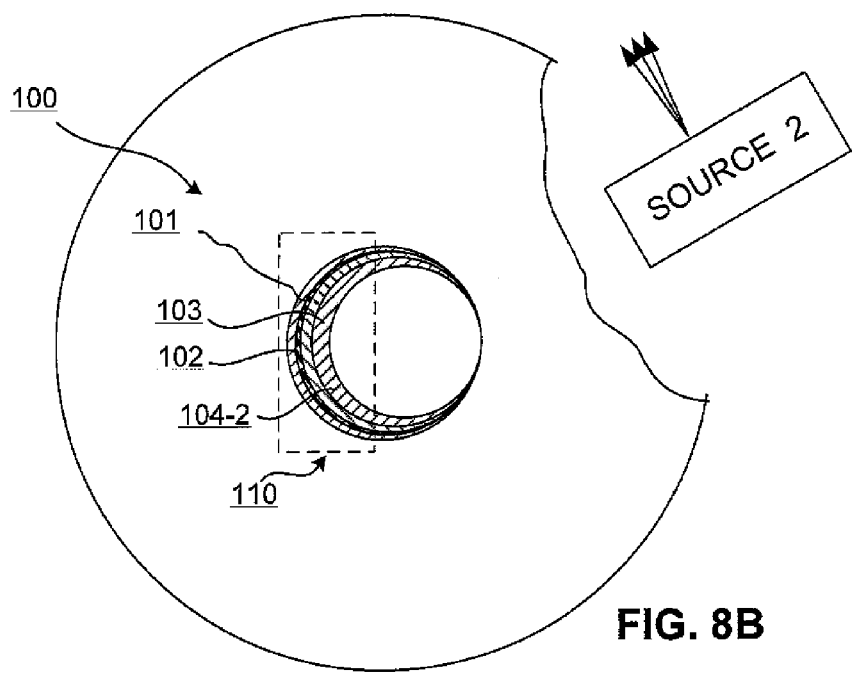
FIG. 8B is a diagrammatic illustration of a cross-sectional top view 8A-8A from FIG. 8A.

FIG. 8A (side view) and FIG. 8B (top view) illustrate yet another embodiment of the MIM TD in accordance with the present invention. The geometry of the formation of the MIM TD is similar to the schematics shown by FIG. 5B. In this design, gold or another high conductivity metallization layer 104-1 is deposited over the first sheet-substrate surface 100-1 by a non-lateral method of deposition with normal incidence of vapor flux, which decreases essentially both high series electrical resistance and thermal resistance of the MIM tunneling junction. This initial step is followed by the first working Metal 1 layer 101 deposition using a non-lateral angled method of deposition from Source 1, which coats completely the top and side surfaces of the first high conductivity metal as well as a left side of the cylindrical surface 100-3 of the intermediate surface of the substrate 100. The next steps include the first functional Metal 1 oxidation and/or its coating with a nanometer thickness tunneling dielectric layer 102 using particularly the ALD method. The second functional Metal 2 layer is deposited by a lateral angled method of deposition from the opposite side of the substrate from Source 2 on the second planar surface 100-2 and conical/pyramidal surface 100-4 of the substrate 100. Thus, the overlapped through the tunneling dielectric cylindrical/prismatic area of the first and the second metals forms a non-planar asymmetrical MIM tunneling junction 110 on the side-wall of the cylindrical/prismatic portion of the hole. In this configuration, the MIM tunneling junction area has the width that includes the thickness of both the metallization 104-1, $H_G$, and the first functional Metal 1 layer 101, $H_M$, as well as the height of the cylindrical/prismatic portion of the substrate hole, $H_S$, and the length of the cylindrical/prismatic hole perimeter, P. The MIM tunneling junction area is estimated as $$A_{MIMTD} = (H_{G1} + H_{M1} + H_S + H_{M1L}) \cdot P \cdot K, \quad (5)$$

where K is a coefficient showing a fraction of the length of the hole perimeter, which is limited to the overlapped area of the coupled metals and depends of the hole aspect ratio as well as the incident angles of deposition, and its capacitance is calculated using Equation 2. To further reduce the MIM TD series electrical resistance and thermal resistance, gold or another high conductivity metallization layer 104-2 is deposited over the second metal layer 103 by a non-lateral angled method of deposition. For this method of formation of the MIM tunneling junction of nanometer scale, submicron lithography is not required.

Figure 9A:
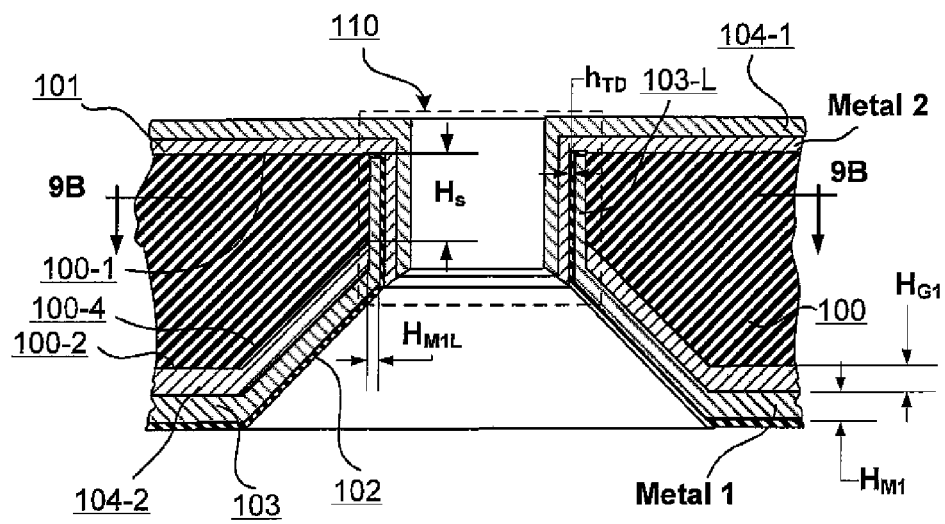
FIG. 9A is a diagrammatic illustration of a cross-sectional side view of an alternate MIM TD designed in accordance with the present invention, shown here to illustrate the MIM TD layers configuration where the MIM tunneling junction is located within the cylindrical/prismatic portion of the hole.
Figure 9B:
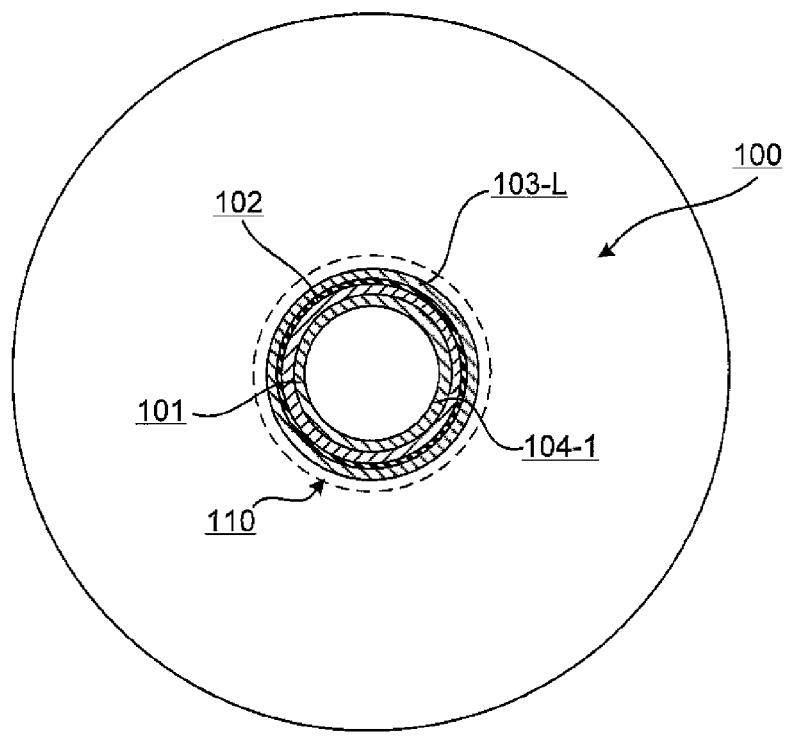
FIG. 9B is a diagrammatic illustration of a cross-sectional top view 9A-9A from FIG. 9A.

Turning now to FIG. 9A (side view) and FIG. 9B (top view), wherein like reference numbers are used to refer to like components, an exemplary embodiment of an MIM tunneling junction with reduced series electrical and thermal resistance of the present invention are illustrated. The geometry of the formation of the MIM TD shown in FIGS. 9A-9B is similar to the schematics shown by FIG. 5A. In this design, gold or another high conductivity metallization layer 104-2 is deposited over the second sheet-substrate surface 100-2 by a non-lateral method of deposition with normal incidence of vapor flux, which decreases essentially both high series electrical resistance and thermal resistance of the MIM tunneling junction. This initial step is followed by the functional Metal 1 layer 102 depositions using a lateral method of deposition, which coats completely the bottom planar and conical/pyramidal surfaces of the first high conductivity metal 104-2 as well as the cylindrical surface 100-3 of the intermediate surface of the substrate 100. The next steps include the oxidation of the working metal layer 103 and/or its coating with a nanometer thickness tunneling dielectric layer 102 using particularly the ALD method. The second functional Metal 2 layer is deposited by a lateral or method of deposition from the opposite side on the first planar surface 100-1 and cylindrical surface 100-3 coated with the tunneling dielectric. Thus, the overlapped through the tunneling dielectric cylindrical/prismatic area of the first and the second metals forms a non-planar MIM tunneling junction 110. In this configuration, the MIM tunneling junction area, which is estimated by Equation 1, has the width that includes the thickness of both the metallization 104-2, $H_{G2}$, and the functional Metal 1 layer 103-L, $H_{M1L}$, as well as the height of the cylindrical/prismatic portion of the substrate hole, $H_S$, and the length of the cylindrical/prismatic hole perimeter, P. To further reduce the MIM TD series electrical resistance and thermal resistance, gold or another high conductivity metal layer 104-1 is deposited over the first metal layer 101 by a lateral method of deposition. For the described above method of formation of the MIM tunneling junction of nanometer scale, submicron lithography is not required.

Figure 10A:
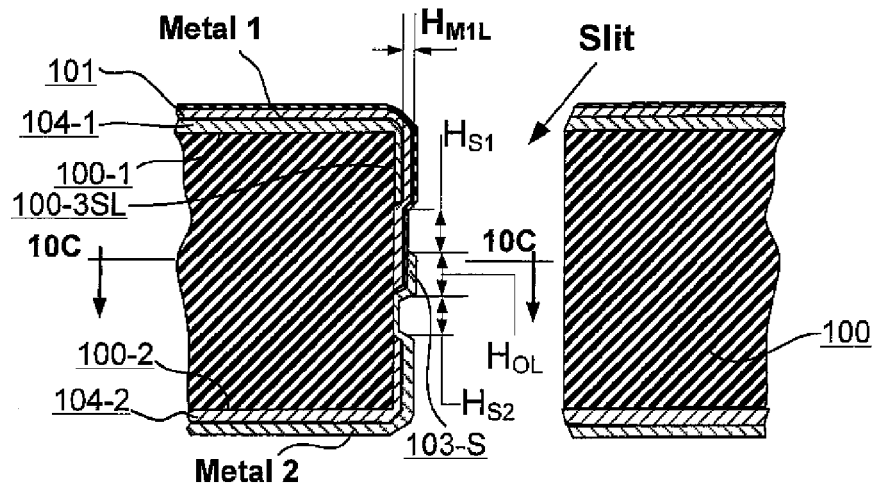
FIG. 10A is a diagrammatic illustration of a cross-sectional side view of a MIM TD designed in accordance with the present invention, shown here to illustrate the MIM TD layers configuration wherein the MIM tunneling junction is located within the side wall of the intermediate surface in the form of a slit.
Figure 10B:
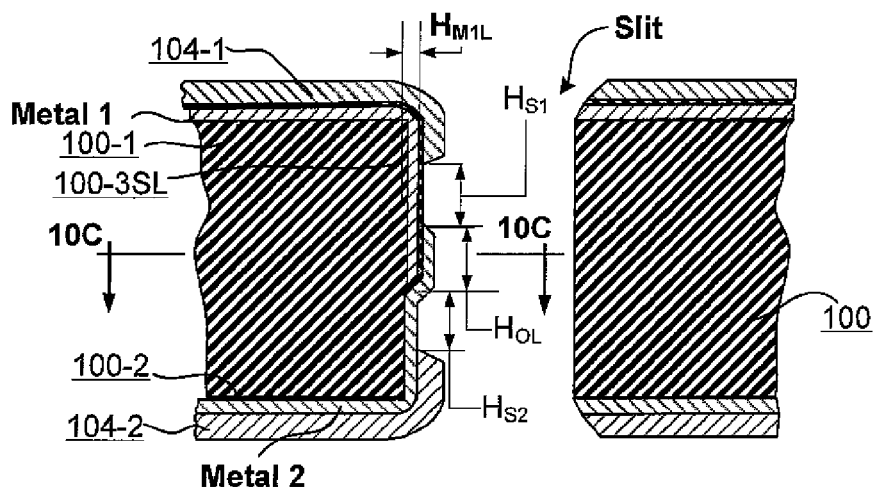
FIG. 10B is a diagrammatic illustration of a cross-sectional side view of an alternate MIM TD designed in accordance with the present invention, shown here to illustrate the MIM TD layers configuration wherein the MIM tunneling junction is located within the side wall of the intermediate surface in the form of a slit.
Figure 10C:
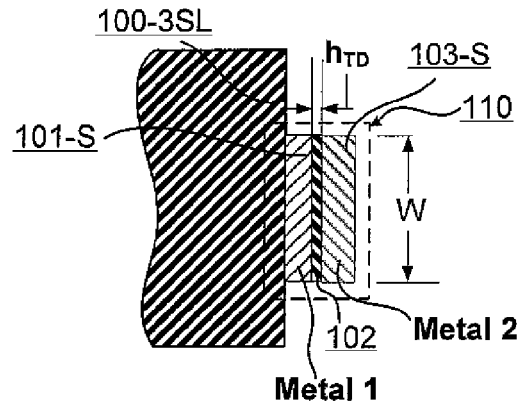
FIG. 10C is a diagrammatic illustration of a cross-sectional side view 10A-10A from FIG. 10A and FIG. 10B.

Turning now to FIG. 10A and FIG. 10C, exemplary embodiments of an MIM tunneling device wherein the MIM tunneling junction located within the side wall of the intermediate surface in the form of a slit designed in accordance with the present invention are shown. The geometry of the formation of the MIM TD is similar to the schematics shown by FIG. 5B. FIG. 10A and FIG. 10C show cross-sectional side and top views of a planar sheet-substrate 100 having the first 100-1 and the second 100-2 planar surfaces and an intermediate surface in the form of a slit 100-3SL having rectangular shape, which extends between and connects the first 100-1 and second 100-2 surfaces. In this design, gold or another high conductivity metallization layer 104-1 is deposited over the first sheet-substrate surface 100-1 by a non-lateral method of deposition with angled incidence of vapor flux. To form a strip metallization of width W across the slit, preliminary resist coating followed by lithography processing to form a strip opening is implemented. The angle of the incidence of metal vapor flux on the left slit surface 100-3SL, as the first layer of the structure, is chosen by such a way that the right slit side functions as a shade mask that allows the metallization coating only on a top fraction of the surface 100-3SL. This layer is to decrease essentially both high series electrical resistance and thermal resistance of the MIM tunneling junction. This initial step is followed by the first functional Metal 1 layer 101 deposition using a non-lateral angled method of deposition with the angle of incidence of vapor flux that is slightly higher than the incident angle of the metallization layer deposition, which allows coating completely the top and side surfaces of the first high conductivity metal as well as a fraction of the intermediate surface 100-3SL of the substrate 100. The next step includes the first functional metal oxidation or its coating with a nanometer thickness tunneling dielectric layer 102 using particularly the ALD method. The second metallization layer is deposited by non-lateral angled method of deposition from the opposite side on the second planar surface 100-2 and slit side surface 100-3SL. The angle of the incident vapor flux on the left slit surface 100-3SL is chosen by such a way that the right slit side functions as a shade mask that allows the metallization coating only on a fraction of the surface 100-3SL and prevents overlapping with the first functional Metal 1 layer 101-S. This step is followed by the second functional Metal 2 layer deposition using a non-lateral angled method of deposition with the angle of the incident flux that is slightly lower than the incident angle of the Metal 2 layer deposition, which allows coating completely the top and side surfaces of the metallization 104-2 as well as a fraction of the intermediate surface 100-3SL of the substrate 100, resulted in overlapping through the tunneling dielectric of the first and the second functional metals, thus forming non-planar MIM tunneling junction 110. In this configuration as well in the configuration shown by FIG. 10B, the MIM tunneling junction area is estimated as $$A_{MIMTD} = H_{OL} \cdot W, \quad (6)$$

where $H_{OL}$ is a height of the overlapped area. By substitution of $A_{MIMTD}$ described by Equation 7 into Equation 2, the capacitance of the MIM tunneling junction can be expressed as $$C_{MIMTD} = \epsilon\epsilon_0 W H_{M1L}/h_{TD} \quad (7)$$

The external resistance of the MIM TD, $R_E$, is mostly limited to the resistance of the non-metalized layer strips of the both functional metals, Metal 1 and Metal 2, which coats the slit edge surface 100-3S and have thickness $H_{M1L}$ and $H_{M2L}$ and lengths $H_{S1}$ and $H_{S2}$, respectively. In this case, the total series resistance of the MIM tunneling junction can be given by $$R_E = \rho_{M1} H_{S1}/(W H_{M1L}) + \rho_{M2} H_{S2}/(W H_{M2L}) \quad (8)$$

Finally, by taking into account the real part of the embedding antenna circuit impedance, $R_A$, and substitution of expressions for $C_{MIMTD}$ and $R_E$, which are taken from Equations 8 and 9, respectively, into Equation 1, the cut-off frequency of the MIM tunneling junction can be estimated. For this method of formation of the MIM tunneling junction of nanometer scale, submicron lithography is not required. However, a slit shade lithography mask or conventional photolithography is required to limit MIM tunneling junction width, W.

FIG. 10B and FIG. 10C show cross-sectional side and top views of an exemplary embodiment of an MIM tunneling junction with reduced series electrical and thermal resistance. The steps of the formation of such a device and the geometry of the MIM tunneling junction are similar to design described by FIG. 10A except of switching the first two steps between each other as well as the last two steps. In this design, the angle of the deposition of the functional Metal 1 on the left slit surface 100-3SL, as the first layer of the structure, is chosen by such a way that the right slit side functions as a shade mask that allows Metal 1 coating on both the surface 101-1 and a top fraction of the surface 100-3SL of the substrate 100. This initial step is followed by the deposition of gold or other high conductivity metal layer 104-1 using a non-lateral angled method of deposition with the angle of the incident flux that is slightly lower than the incident angle of the Metal 1 layer deposition, which leaves the bottom portion of 101-S layer uncovered by 104-1 metallization. This layer is to decrease essentially both high series electrical resistance and thermal resistance of the MIM tunneling junction. The next step includes the first functional Metal 1 oxidation or its coating with a nanometer thickness tunneling dielectric layer 102 using particularly the ALD method. The second functional Metal 2 layer is deposited by non-lateral angled method of deposition from the opposite side on the second planar surface 100-2 and slit side surface 100-3SL. The angle of deposition on the left slit surface 100-3SL is chosen by such a way that the right slit side functions as a shade mask that allows the functional Metal 2 coating only on a fraction of the surface 100-3SL, which results in overlapping through the tunneling dielectric of the first and the second functional metals, thus forming non-planar MIM tunneling junction 110. In this configuration, the MIM tunneling junction area is estimated using Equation 6. To further reduce the MIM TD series electrical and thermal resistance, gold or another high conductivity metal layer 104-2 is deposited over the functional Metal 2 layer 103-S and 103 by a non-lateral angled method of deposition. The angle of the deposition of the metallization on 100-2 and 100-3SL surfaces is chosen by such a way that the right slit side functions as a shade mask that allows gold coating only on a fraction of the surface 100-3SL and prevents the metal deposition directly on the MIM tunneling junction are 110. For this method of formation of the MIM tunneling junction of nanometer scale, submicron lithography is not required. However, a slit shade lithography mask or conventional photolithography is required to limit MIM tunneling junction width.

Figure 11A:
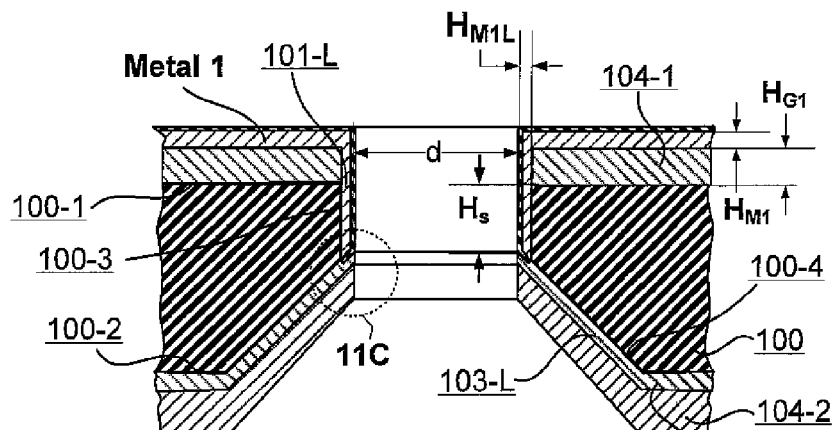
FIG. 11A is a diagrammatic illustration of a cross-sectional side view of a MIM TD designed in accordance with the present invention, shown here to illustrate the MIM TD layers configuration where the MIM tunneling junction is located within the cylindrical/prismatic portion of the hole along the line of the intersection of the conic/pyramidal and cylindrical/prismatic surfaces of the hole.
Figure 11B:
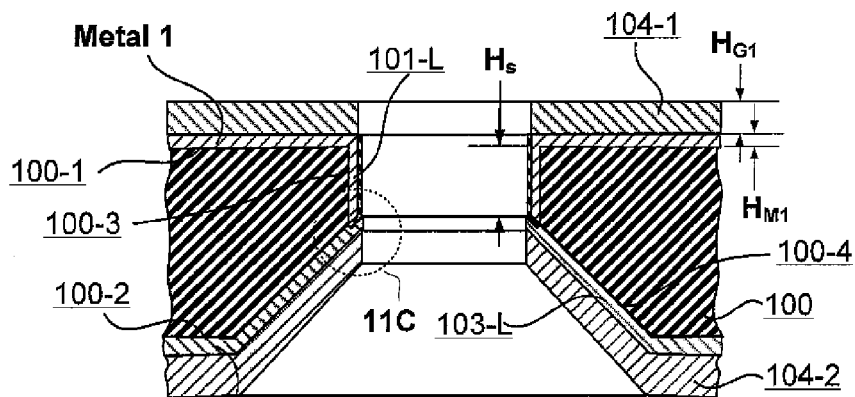
FIG. 11B is a diagrammatic illustration of a cross-sectional side view of an alternate MIM TD designed in accordance with the present invention, shown here to illustrate the MIM TD layers configuration where the MIM tunneling junction is located within the cylindrical/prismatic portion of the hole along the line of the intersection of the conic/pyramidal and cylindrical/prismatic surfaces of the hole.
Figure 11C:
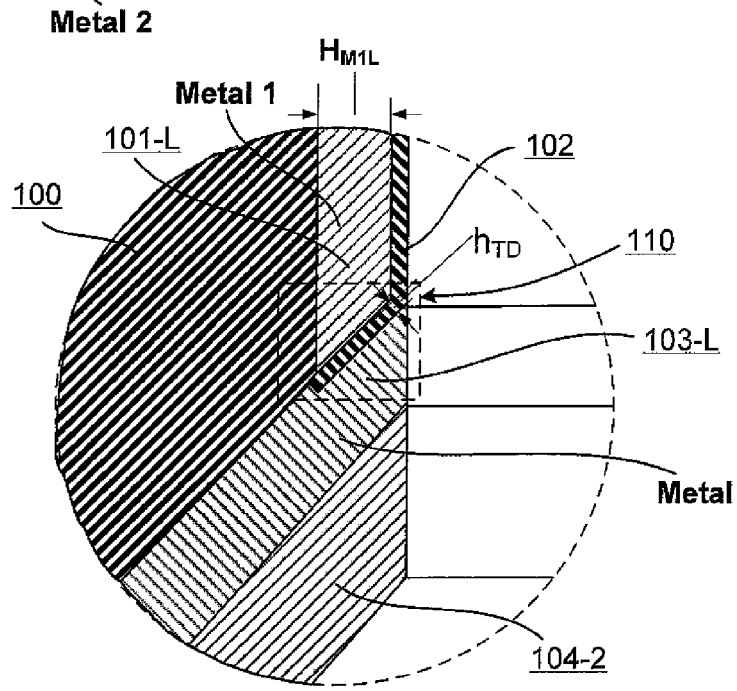
FIG. 11C is a diagrammatic illustration of a cross-sectional side magnified View A from FIG. 11A and FIG. 11B.

Turning now to FIGS. 11A-11C, an exemplary embodiment of an MIM tunneling junction with reduced series electrical and thermal resistance accompanied by significant decreasing MIM tunneling junction in accordance with the present invention is described. The geometry of the formation of the MIM TD shown in FIG. 9A has a similarity to the schematic shown by FIG. 5C. The steps of the formation of a such device are similar to the design described by FIG. 7A and FIG. 7B above except of the last two stages, when both the second working metal layer 103 and metallization layer 104-2 are deposited by a non-lateral method of deposition with normal incidence of vapor flux from the opposite side of the substrate on its second 100-2 planar surface. The overlapped through the tunneling dielectric the edges of Metal 1 101-L and Metal 2 103-L metal layers forms a non-planar MIM tunneling junction 110 having the width in the order of the lateral thickness, $H_{M1L}$, of the first functional Metal 1 layer 101-L and the length of the cylindrical/prismatic hole perimeter, P. In this configuration as well in the configurations shown in FIGS. 12A-12C, at the approximation when $H_{M1L} \ll P$, the MIM tunneling junction area is estimated as $$A_{MIMTD} = k^* H_{M1L}^* P, \quad (9)$$

where k is a coefficient related to the geometry of the edge of the layer 101-L and depends of both the intermediate surface geometry and methods and conditions of the deposition. By substitution of $A_{MIMTD}$ described by Equation 9 into Equation 2, the capacitance of the MIM tunneling junction can be expressed as $$C_{MIMTD} = \epsilon \epsilon_0 A_{MIMTD}/h_{TD} = k \epsilon \epsilon_0 \pi d H_{M1L}/h_{TD} \quad (10)$$

The external resistance of the MIM TD, $R_E$, shown in FIGS. 11A-12C, is mostly limited to the resistance of the cylindrical/prismatic non-metalized layer of the functional Metal 1, which coats the cylindrical/prismatic surface 100-3 and has thickness $H_{M1L}$ and length $H_s$. In the case of cylindrical surface, the series resistance of the MIM tunneling junction can be given by $$R_E = \rho_{M1}^* H_s/A_{MIMTD} = \rho_{M1} \cdot H_s/(\pi d H_{M1L}), \quad (11)$$

Finally, by taking into account the real part of the embedding antenna circuit impedance, $R_A$, and substitution of expressions for $C_{MIMTD}$ and $R_E$, which are taken from Equations 11 and 12, respectively, into Equation 1, the cut-off frequency of the MIM tunneling junction can be estimated. For this method of formation of the MIM tunneling junction of nanometer scale, submicron lithography is not required.

FIG. 11B and FIG. 11C are edge views of an exemplary embodiment of another MIM tunneling junction with reduced series electrical and thermal resistance. The steps of the formation of such a device and the geometry of the MIM tunneling junction are similar to the design described above by FIG. 11A except of the first two steps, when the Metal 1 layer 101 is deposited by a lateral method of deposition on the first 100-1 planar surface of the substrate. This layer coats completely the top planar 100-1 and lateral cylindrical surfaces 100-3 of the intermediate surface of the substrate 100. Gold or another high conductivity metal is deposited over the first working metal layer with normal incidence of vapor flux from the same side on the first 100-1 planar surface of the substrate 100. The magnified picture of the configuration of the MIM tunneling junction 110 is shown in FIG. 11C and its area, capacitance, resistance, and cut-off frequency can be calculated using Equations 10, 11, and 1, respectively. For this method of formation of the MIM tunneling junction of nanometer scale, submicron lithography is not required.

Figure 12A:
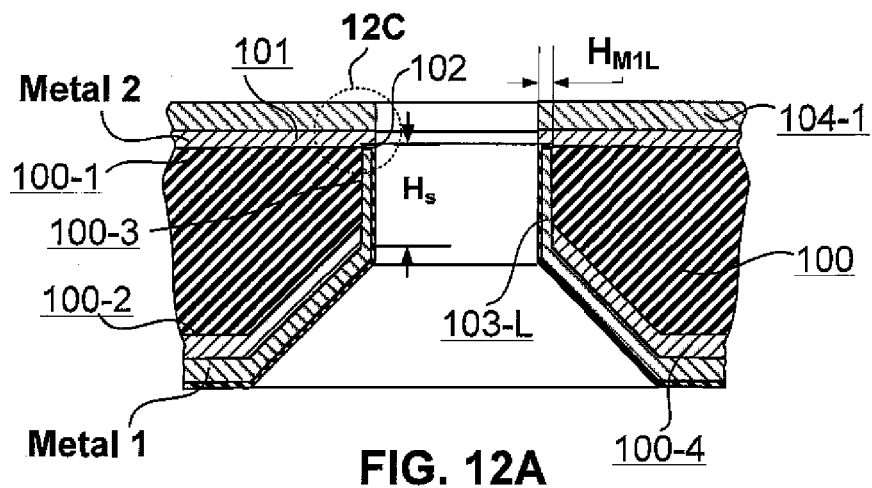
FIG. 12A is a diagrammatic illustration of a cross-sectional side view of a MIM TD designed in accordance with the present invention, shown here to illustrate the MIM TD layers configuration where the MIM tunneling junction is located at the intersection of the cylindrical/prismatic hole side wall and the first planar surface and the plane of the junction is along the plane of the first planar surface.
Figure 12B:
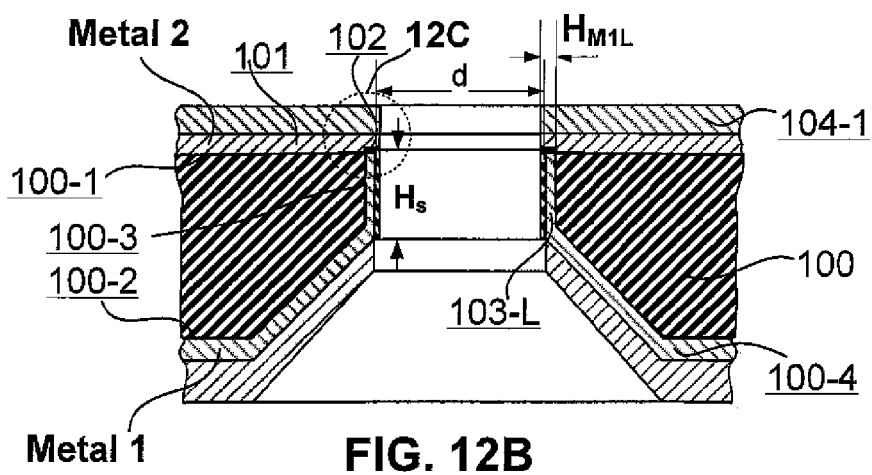
FIG. 12B is a diagrammatic illustration of a cross-sectional side view of an alternate MIM TD designed in accordance with the present invention, shown here to illustrate the MIM TD layers configuration where the MIM tunneling junction is located at the intersection of the cylindrical/prismatic hole side wall and the first planar surface and the plane of the junction is along the plane of the first planar surface.
Figure 12C:
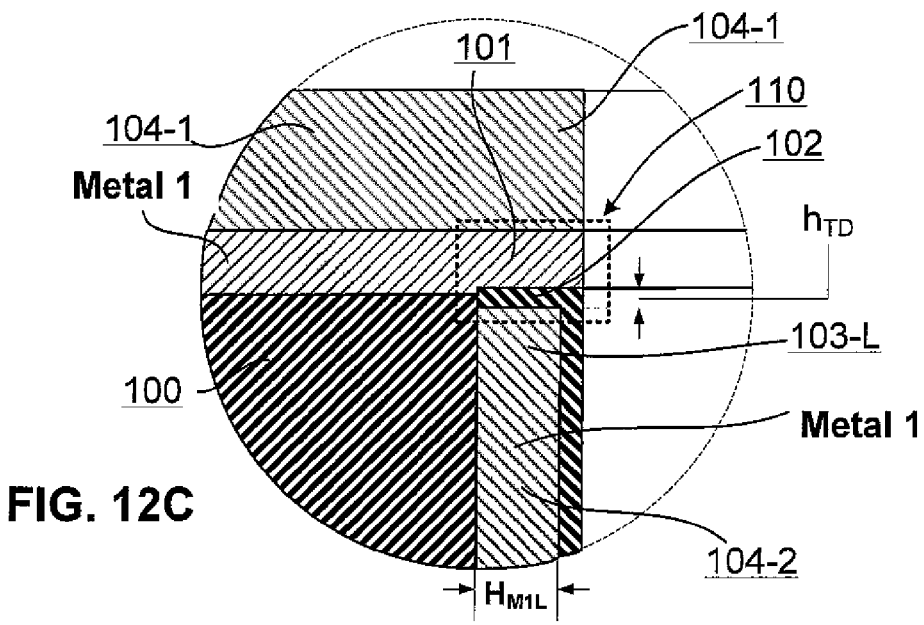
FIG. 12C is a diagrammatic illustration of a cross-sectional side magnified View A from FIG. 12A and FIG. 12B.

Still other possible modifications of an exemplary embodiment of an MIM tunneling junction with reduced series electrical and thermal resistance accompanied by significant decreasing MIM tunneling junction area as compared to the design illustrated by FIG. 9A and FIG. 9B are illustrated in FIGS. 12A, 12C. The geometry of the formation of the MIM TD shown in FIG. 12A has a similarity to the schematic shown by FIG. 5C. The steps of the formation of a such device are similar to the design illustrated by FIG. 11A and FIG. 11B except of the last two stages, when both the functional Metal 2 layer 101 and metallization layer 104-1 are deposited by a non-lateral method of deposition with normal incidence of vapor flux from the opposite side on the first 100-1 planar surface of the substrate 100. The overlapped through the tunneling dielectric area within the edges of Metal 1 103-L and Metal 2 101 layers forms a non-planar MIM tunneling junction 110 located at the intersection of the cylindrical/prismatic hole side wall and the first planar surface with the plane of the junction along the plane of the first planar surface. In this configuration, the junction has the width in the order of the lateral thickness, $H_{M1L}$, of the functional Metal 1 layer 103-L and the length of the cylindrical/prismatic hole perimeter, P. In this configuration, to the MIM tunneling junction area is described by Equation 10 with k=1 for the planar configuration of 100-1 surface of the substrate. The magnified picture of the configuration of the MIM tunneling junction 110 is shown in FIG. 12C and its capacitance, resistance, and cut-off frequency are described by Equations 10, 11, and 1, respectively. For this method of formation of the MIM tunneling junction of nanometer scale, submicron lithography is not required.

As yet another alternative, the design shown in FIG. 12B and the steps of its formation are similar to the MIM tunneling junction of FIG. 12A except of the first two steps, when the Metal 1 layer 103 is deposited by a lateral method of deposition on the second 100-2 planar surface of the substrate as the first step of the junction formation. This layer coats completely the planar 100-2, conical/prismatic 100-4, and lateral cylindrical 100-3 surfaces of the substrate 100. Gold or another high conductivity metal is deposited over the Metal 1 layer with normal incidence of vapor flux from the same side on the second 100-2 planar surface of the substrate 100. The magnified picture of the configuration of the MIM tunneling junction 110 is shown in FIG. 12C and its area, capacitance, resistance, and cut-off frequency can be estimated using Equations 10-12, and 1, respectively. For this method of formation of the MIM tunneling junction of nanometer scale, submicron lithography is not required.

Figure 13A:
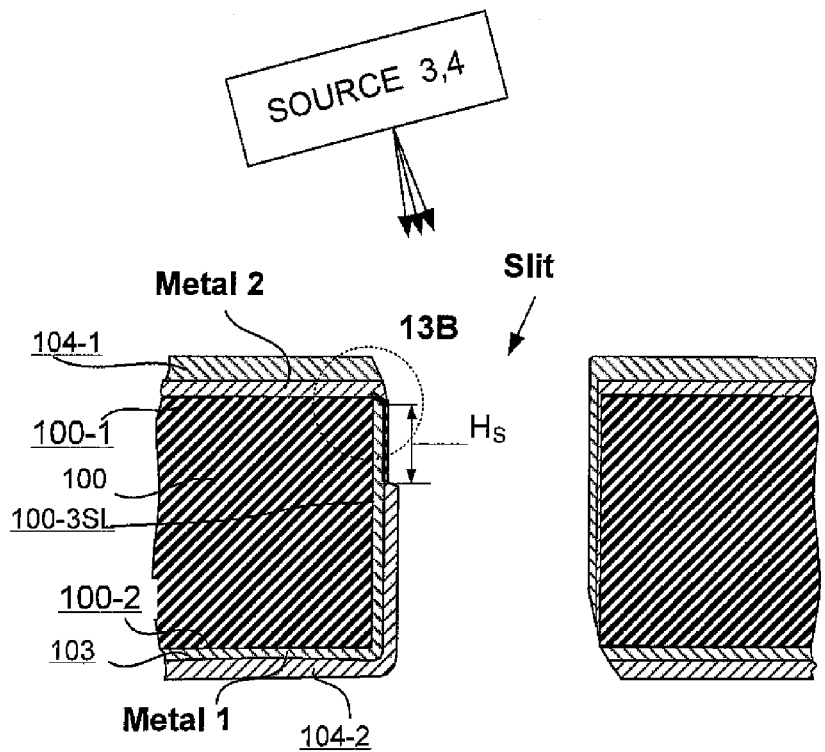
FIG. 13A is a diagrammatic illustration of a cross-sectional side view of a MIM TD designed in accordance with the present invention, shown here to illustrate the MIM TD layers configuration wherein the MIM tunneling junction is located at the intersection of the slit side wall and the first planar surface.
Figure 13B:
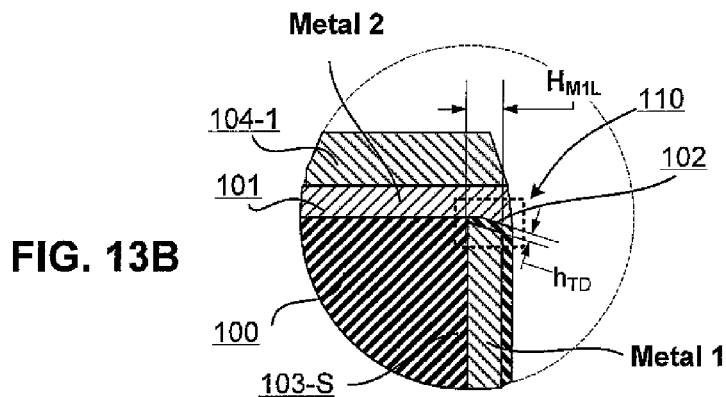
FIG. 13B is a diagrammatic illustration of a cross-sectional side magnified View A from FIG. 13A.

Still other possible modifications of an exemplary embodiment of an MIM tunneling junction with reduced series electrical and thermal resistance accompanied by significant decreasing MIM tunneling junction area as compared to the design illustrated by FIG. 10A and FIG. 10B are illustrated in FIGS. 13A-13B. The geometry of the formation of the MIM TD has a similarity to the schematic shown by FIG. 5D. FIG. 13A and FIG. 13B show cross-sectional side view of a planar sheet-substrate 100 having the first 100-1 and the second 100-2 planar surfaces and an intermediate surface in the form of a slit 100-3S having rectangular shape, which extends between and connects the first 100-1 and second 100-2 surfaces. In this design, the first functional Metal 1 layer 103 is deposited over the second sheet-substrate surface 100-2 and the left slit's side-wall by a non-lateral method of deposition with angled incidence of vapor flux from Source 1. The angle of the incidence of Metal 1 vapor flux on the left slit surface 100-3SL, as the first layer of the structure, is chosen by such a way that the side wall 100-3L is completely coated by Metal 1. This initial step is followed by the first metallization layer 104-2 deposition using a non-lateral angled method of deposition with the angle of incidence of vapor flux that allows the right slit side to function as a shade mask that limits the metallization coating only on a bottom fraction of the surface 100-3L. This layer is to decrease essentially both high series electrical resistance and thermal resistance of the MIM tunneling junction. The next step includes the first functional metal oxidation or its coating with a nanometer thickness tunneling dielectric layer 102 using particularly the ALD method. This step is followed by the second functional Metal 2 layer deposition using a non-lateral angled method of deposition with the angle of the incident flux that allows coating of the first planar surface 100-1 and the top edge of Metal 1 through the tunneling dielectric on the side-wall of the slit. To form a metal strip of width W across the slit, preliminary resist coating over planar surface 100-1 followed by lithography processing to form a strip opening is implemented. And finally, the metallization layer over Metal 2 using a non-lateral angled method of deposition with the angle of the incident flux that allows coating of the Metal 2 coating on the planar surface 100-1 is implemented, which is resulted in formation of the MIM tunneling junction at the intersection of the slit side wall and the first planar surface. In this configuration, the MIM tunneling junction area is estimated as $$A_{MIMTD} = H_{M1L} * W, \quad (12)$$

where $N_{M1L}$ is a lateral thickness of the first deposited metal strip of width W. By substitution of $A_{MIMTD}$ described by Equation 12 into Equation 2, the capacitance of the MIM tunneling junction can be expressed as $$C_{MIMTD} = \epsilon \epsilon_0 A_{MIMTD} / h_{TD} = k \epsilon \epsilon_0 W H_{M1L} / h_{TD} \quad (13)$$

The external resistance, $R_E$, of the MIM TD shown in FIGS. 13A-13B, is mostly limited to the resistance of the non-metalized layer strip of the functional metal Metal 1, which coats the slit edge surface 100-3SL and has thickness $H_{M1L}$ and lengths $H_S$. In this case, the total series resistance of the MIM tunneling junction can be given by $$R_E = \rho_{M1} * H_S / A_{MIMTD} = \rho_{M1} * H_S / (W H_{M1L}), \quad (14)$$

Finally, by taking into account the real part of the embedding antenna circuit impedance, $R_A$, and substitution of expressions for $C_{MIMTD}$ and $R_E$, which are taken from Equations 13 and 14, respectively, into Equation 1, the cut-off frequency of the MIM tunneling junction can be estimated. The cut-off frequency analysis of the design shown in FIGS. 13A-13B is also applicable to the design shown in FIGS. 14A-14B. For this method of formation of the MIM tunneling junction of nanometer scale, submicron lithography is not required. However, a slit shade lithography mask or conventional photolithography is required to limit MIM tunneling junction length (or the strip width, W).

Figure 14A:
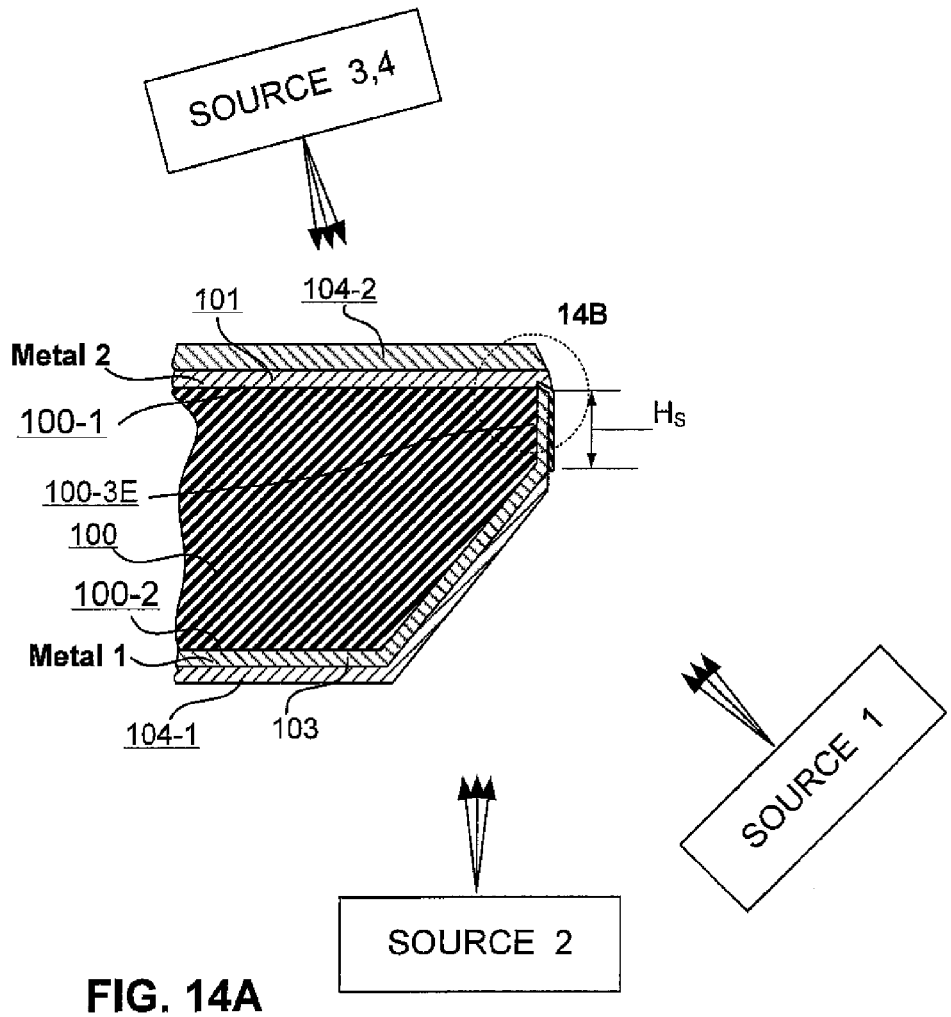
FIG. 14A is a diagrammatic illustration of a cross-sectional side view of a MIM TD designed in accordance with the present invention, shown here to illustrate the MIM TD layers configuration wherein the MIM tunneling junction is located at the intersection of the edge wall and the first planar surface.
Figure 14B:
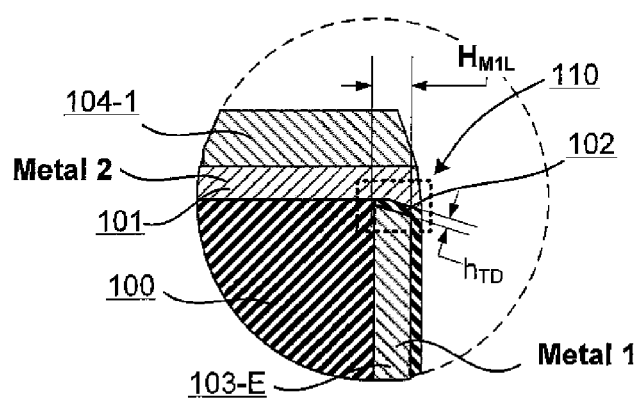
FIG. 14B is a diagrammatic illustration of a cross-sectional side magnified View A from FIG. 14A.

Alternatively, the MIM tunneling junction located at the intersection of the edge wall and the first planar surface can be formed at the edge of the substrate. FIG. 14A and FIG. 14B show cross-sectional side view of a planar sheet-substrate 100 having the first 100-1 and the second 100-2 planar surfaces and an intermediate surface in the form of an edge 100-3E having rectangular shape, which extends between and connects the first 100-1 and second 100-2 surfaces. The geometry of the formation of the MIM tunneling junction is similar to the schematic shown by FIG. 13A and FIG. 13B with the exception that the first metallization layer 104-2 is deposition using a non-lateral angled method of deposition using Source 2 that is directed toward the planar surface 100-2 only. The MIM tunneling junction made by this way is located at the intersection of the slit side wall and the first planar surface and its area is estimated by Equation 14. For this method of formation of the MIM tunneling junction of nanometer scale, submicron lithography is not required. However, a slit shade lithography mask or conventional photolithography is required to limit MIM tunneling junction length.

In order to achieve high efficiency at the desired operating frequency, ω, the rf-resistance of the MIM tunneling junction must be relatively close to the real part of the embedding antenna circuit impedance, which requires maintaining the following condition $$1/(\omega C_{MIMTD}) = R_A + R_E \quad (15)$$

that identifies design criteria for the MIM TD.

For the embodiments described by FIGS. 11A-14B, the capacitance of the MIM tunneling junction can be expressed as $$C_{MIMTD} = \epsilon \epsilon_0 A_{MIMTD} / h_{TD}, \quad (16)$$

and the external resistance of the MIM TD, $R_E$, can be given by $$R_E = \rho_{M1} * H_S / A_{MIMTD}, \quad (17)$$

Finally, by taking into account the real part of the embedding antenna circuit impedance, $R_A$, and substitution of expressions for $C_{MIMTD}$ and $R_E$, which are taken from Equations 16 and 17, respectively, into Equation 15, the following equation for the optimized area, $A_{MIMTD}$, is derived:

$$A_{MIMTD} = [h_{TD}/(\epsilon\epsilon_0\omega) - \rho_{M2}H_s]/R_A, \quad (18)$$

where $A_{MIMTD} = W\,H_{M1L}$ for the intermediate surface in the form of the slit/edge and $A_{MIMTD} = \pi d H_{M1L}$ for the intermediate surface of the cylindrical shape.

The expression for the optimized area of the MIM TD shown by Equation 18 is positive or equals zero if $$H_s/h_{TD} \le 1/(\epsilon\epsilon_0\omega) \cdot 1/\pi_{M1}\rho_{CRF}/\rho_{M1}, \quad (19)$$

where the ratio of two design parameters, $H_s/h_{TD}$, namely, the height of the cylindrical/prismatic portion of the hole, $H_s$, and tunneling dielectric thickness, $h_{TD}$, is defined as the electrode geometry factor, $E_{GF}$, and $\rho_{CRF} = 1/(\epsilon\epsilon_0\omega)$ is defined as the critical resistivity factor. The received relationship between geometry design parameters and materials properties is surprising and unexpectedly, results in much higher flexibility in designing an optimized MIM TD. In addition, the thickness of the Metal 1 layer coated surface 100-3 cannot be unlimitedly decreased because of percolative behavior of ultrathin metal films resulting in drastically increased metal film resistivity at a thickness lower than 6 nm, which defines the minimum thickness, $H_{M1L}$ (min)=6 nm of the functional metal coating and depends of the material metallurgical properties. This immediately results in the following inequality condition:

$$W_{max} = \pi d_{max} \le [h_{TD}/(\epsilon\epsilon_0\omega) - \rho_{M1}H_s]/[H_{M1L}(\min)R_A], \quad (20)$$

which can be rewritten as $$J_{LF} = W/h_{TD} = \pi d/h_{TD} \le [\rho_{CRF} - \rho_{M1}E_{GF}]/[H_{M1L}(\min)R_A], \quad (21)$$

where W is the width of the electrode microstrip across the slit/edge of the substrate or the perimeter of the cylindrical/prismatic portion of the hole in the hole design. The ratio, $W/h_{TD}$, is defined as the junction length factor, $J_{LF}$. Thus, the described above inequality criteria of both Inequality 19 and Inequality 21 should be satisfied for the optimized MIM TD design development.

Figure 15A:
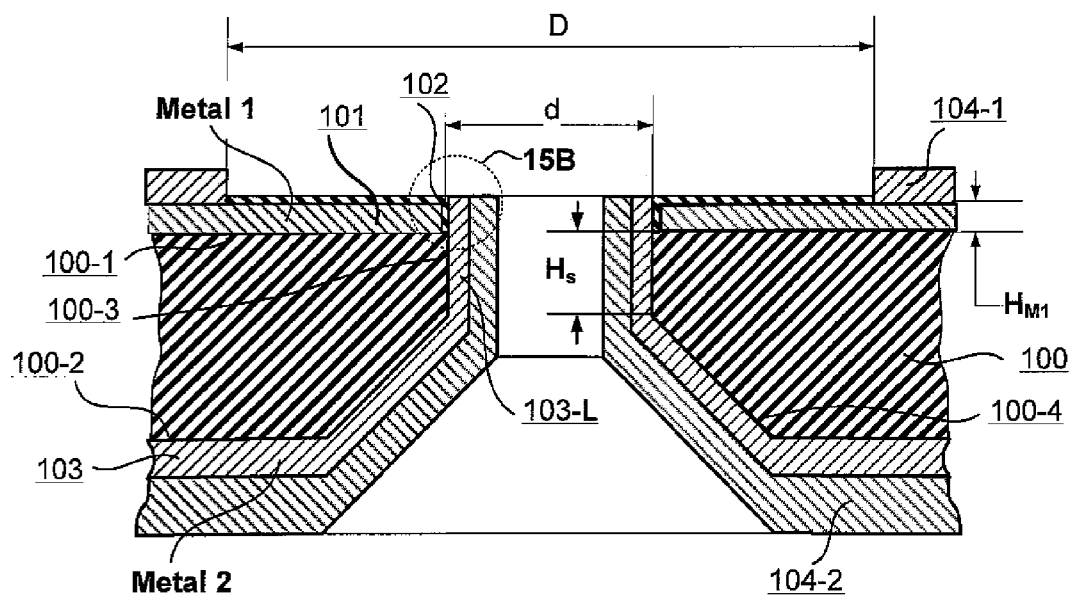
FIG. 15A is a diagrammatic illustration of a cross-sectional side view of a MIM TD designed in accordance with the present invention, shown here to illustrate the MIM TD layers configuration where the MIM tunneling junction is located within the cylindrical/prismatic portion of the hole along the line of the intersection of the first planar and cylindrical/prismatic surfaces of the hole.
Figure 15B:
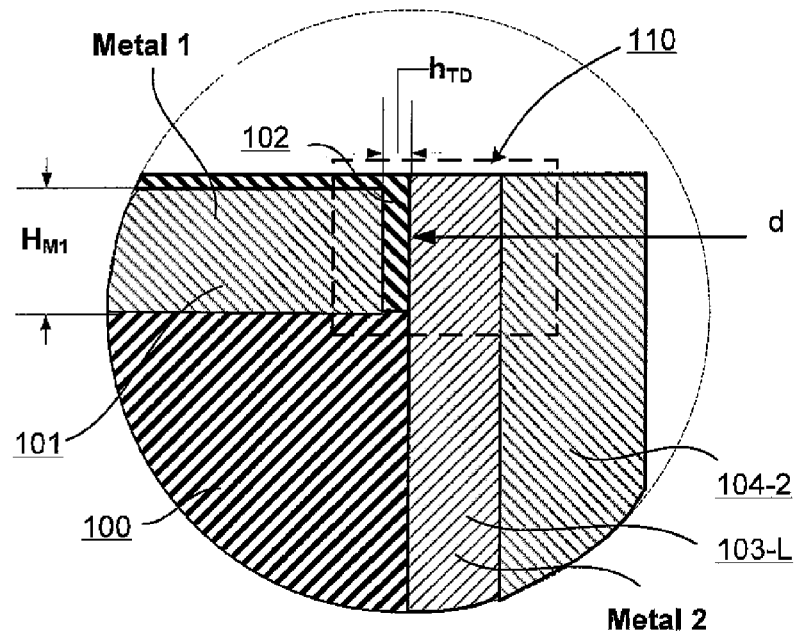
FIG. 15B is a diagrammatic illustration of a cross-sectional side magnified View A from FIG. 15A.

FIG. 15A and FIG. 15B illustrate another modification of an exemplary embodiment of an MIM tunneling junction with reduced series electrical and thermal resistance accompanied by significant decreasing MIM tunneling junction area as compared to the design illustrated by FIG. 7A and FIG. 7B. The geometry of the formation of the MIM TD layers shown in FIG. 15A has a similarity to the schematic shown by FIG. 5C. The steps of the formation of such a device are similar to the design described by FIG. 7A and FIG. 7B except of the first two steps, when the Metal 1 layer 101 is deposited by a non-lateral method of deposition on the first 100-1 planar surface of the substrate with normal incidence of vapor flux. The overlapped through the tunneling dielectric the edges of the first (Metal 1) 101 and the second (Metal 2) 103-L layers forms a non-planar MIM tunneling junction 110 having the width in the order of the thickness, $H_M$, of the first functional Metal 1 layer 101 and the length of the cylindrical/prismatic hole perimeter, P. In this case, the MIM tunneling junction area is decreased to $$A_{MIMTD} = H_{M1} * P, \quad (22)$$

where $P = \pi d$ for a cylindrical hole.

By substitution of $A_{MIMTD}$ described by Equation 21 into Equation 2, the capacitance of the MIM tunneling junction can be expressed as $$C_{MIMTD} = \epsilon\epsilon_0 \pi d H_{M1}/h_{TD} \quad (23)$$

To further reduce the MIM TD series electrical resistance and thermal resistance, gold or another high conductivity metallization layer 104-1 is deposited over the Metal 1 layer 101 except of the area of the diameter D in the vicinity of the MIM tunneling junction using photolithography processing. The external resistance of the MIM TD, $R_E$, shown in FIGS. 15A-15B, is mostly limited to the resistance of the non-metalized layer of the functional Metal 1 of thickness $H_{M1}$ coated the planar surface 100-1 within a hole disk with outer and inner diameters of D and d, respectively. In this case, the series electrode resistance of the MIM tunneling junction can be given by $$R_E = \rho_{M1} \cdot \ln(D/d)/(2\pi H_{M1}) \quad (24)$$

By taking into account the real part of the embedding antenna circuit impedance, $R_A$, and substitution into Equation 15 of expressions for $C_{MIMTD}$ and $R_E$, which are taken from Equations 23 and 24, respectively, results in the following inequality equation The expression for the optimized area of the MIM TD shown by Equation 18 is positive or equals zero if $$(\tfrac{1}{2})\ln(D/d)/h_{TD} < 1/(\epsilon\epsilon_0\omega) \cdot 1/\rho_{M1} = \rho_{CRF}/\rho_{M1}, \quad (25)$$

where $E_{GF} = (\tfrac{1}{2})\mathrm{Ln}(D/d)/h_{TD}$ is defined as the electrode geometry factor for this configuration, and $\pi_{CRF} = 1/(\epsilon\epsilon_0\omega)$ is the critical resistivity factor.

Figure 16A:
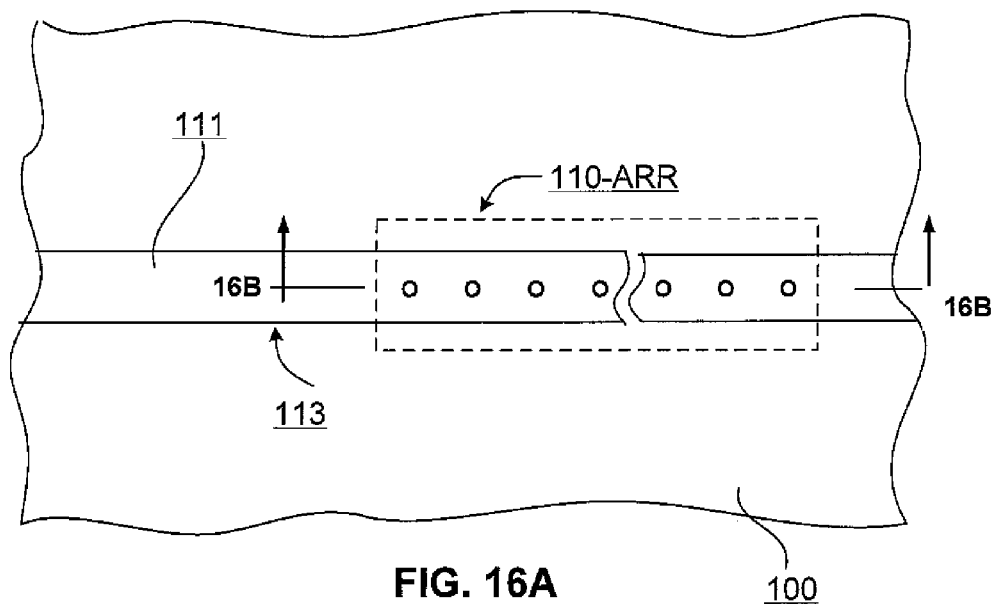
FIG. 16A is a diagrammatic illustration of a top view of a MIM TD array designed in accordance with the present invention, shown here to illustrate the MIM TD array configuration wherein the MIM tunneling junctions are connected in parallel
Figure 16B:
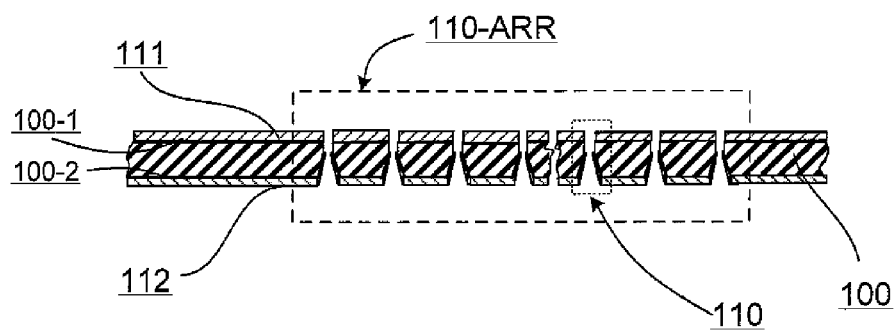
FIG. 16B is a diagrammatic illustration of a cross-sectional side view 16A-16A from FIG. 16A.

Taking into account that the thickness of the Metal 1 layer coated surface 100-1 cannot be unlimitedly decreased because of percolative behavior of ultrathin metal and limits to the minimum, $H_{M1L}$ (min)=6 nm, the equation that is identical to Equation 21 can be derived. The only difference is that the electrode geometry factor used for this configuration is $E_{GF} = (\tfrac{1}{2})\ln(D/d)/h_{TD}$. Thus, the described above inequality criteria of both Inequality 25 and Inequality 21 should be satisfied for the optimized MIM TD design development. Turning now to FIGS. 16A and 16B, a MIM TD array designed in accordance with the present invention, shown here as an example of the MIM TD array configuration wherein the MIM tunneling junctions of the array are connected in parallel. FIG. 16A and FIG. 16B show top and cross-sectional side views of an array 110-ARR of non-planar metal-insulator-metal tunneling devices connected in parallel, which is formed on a planar sheet-substrate 100 having the first 100-1 and the second 100-2 planar surfaces and an intermediate surface in the form of a hole array with the holes extending between and connecting the first 100-1 and second 100-2 surfaces. The method provides a) forming a first metal electrode for each metal-insulator-metal tunneling junction 110 of the array 110-ARR, which are connected to each other by predetermined shape first metallization coating 111;

b) forming tunneling oxide by oxidation of first functional metal or its coating with a nanometer thickness tunneling dielectric layer using particularly the ALD method;

c) forming a second metal electrode of each metal-insulator-metal tunneling junction 110 of the array 110-ARR on the opposite side of the sheet-substrate, which are connected to each other by predetermined shape second metallization coating 112.

In all the embodiments shown in FIGS. 7-20, to increase the spectral intensity of the tunneling-assisted photon emission and photon-absorption in MIM TDs, transition metals or metal alloys possessing high density states in the region of free and occupied electron states are the most desirable. Among them are nickel, cobalt, molybdenum, manganese, iron, tungsten, niobium, platinum and others. In all the embodiments shown in FIGS. 7-20, the tunneling oxide layer is selected from the group of native oxides of the first deposited functional metal. In another group of embodiments shown in FIGS. 7-20, the native oxide layer is followed by the formation of the same material using different method formation of the oxide, particularly, the ALD method. Such approach allows formation of improved pin-hole free tunneling dielectric layer. In still another group of embodiments shown in FIGS. 7-20, multilayer tunneling dielectric structures suitable for tunneling may be used instead of the single layer tunneling dielectric structure, which may improve non-linearity of I-V characteristics of MIM tunneling junctions There are numerous variations in both configuration and materials, which remain within the scope of the invention. A single junction or a junction array in any parallel or series combination is possible. The MIM TD of present invention has been especially designed for CMOS processing and using in large arrays, where the arrays may take on any large number of possible configurations.

INDUSTRIAL APPLICABILITY

Figure 17:
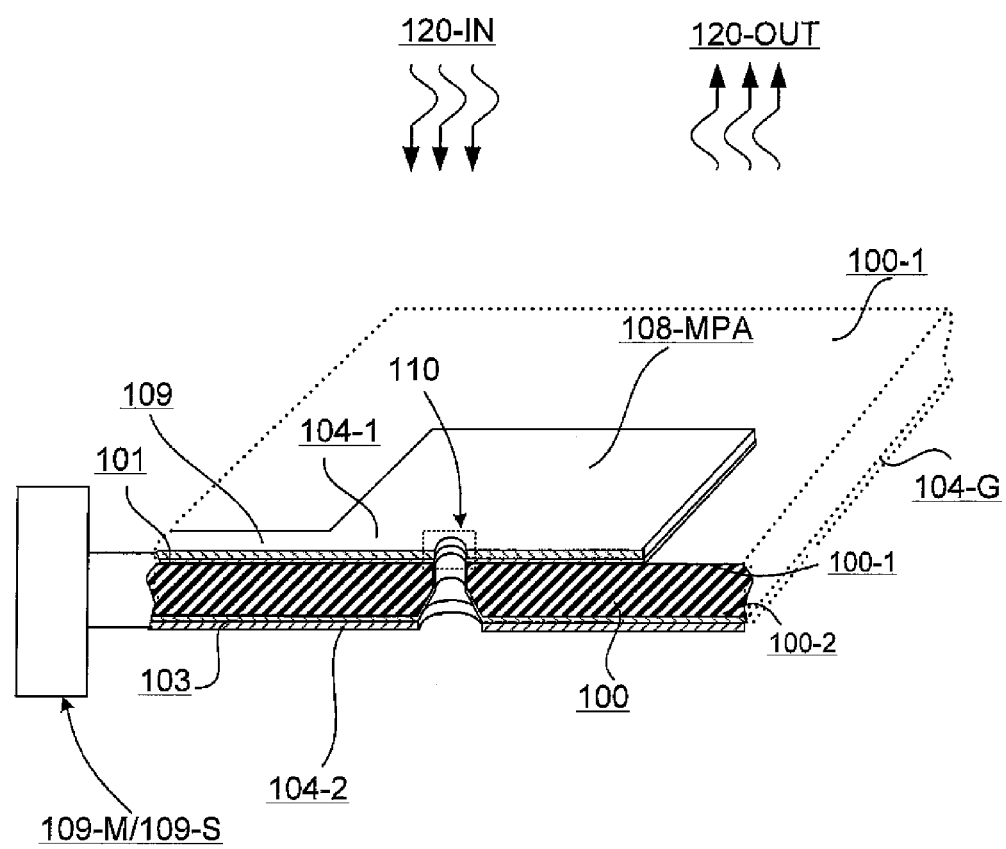
FIG. 17 is a perspective view of an amplifier/emitter comprising of a microstrip patch antenna (MPA) formed on the sheet-substrate and the present invention non-planar MIM TD.
Figure 18A:
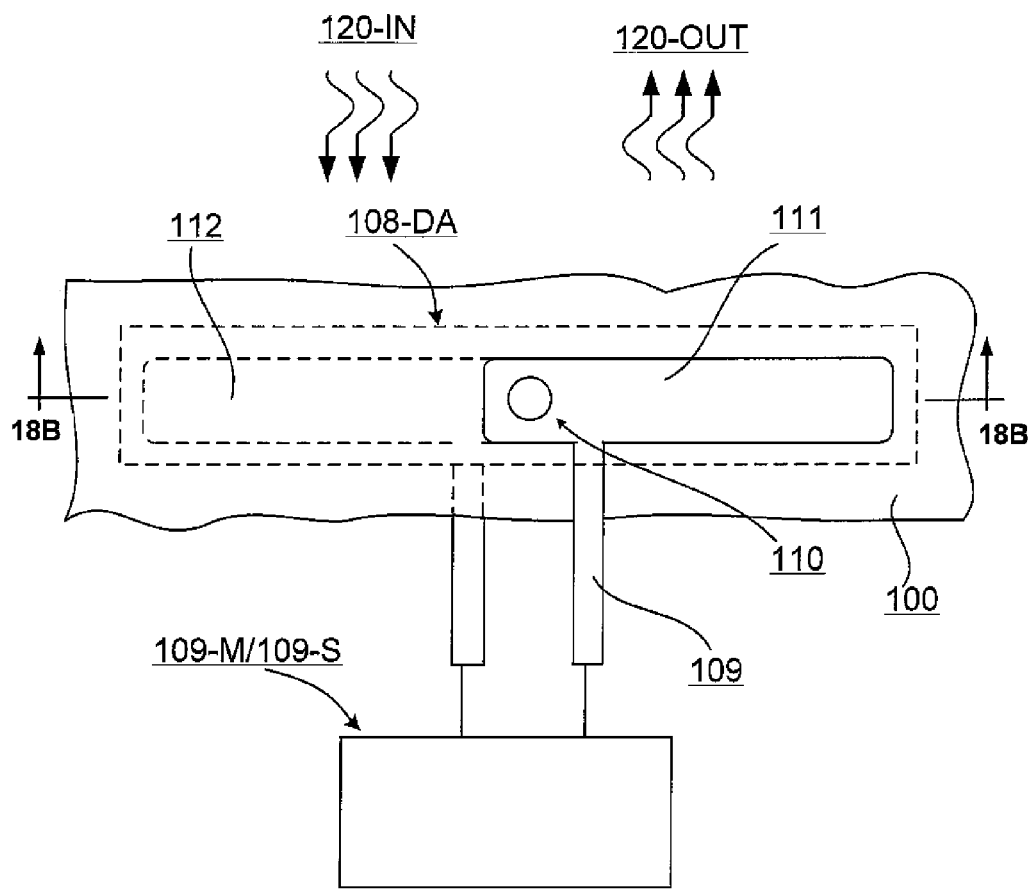
FIG. 18A is a top view of an amplifier/emitter comprising of a dipole antenna consisted of metal strips, one on each side of the sheet—substrate, which are connected by the present invention non-planar MIM TD.
Figure 18B:
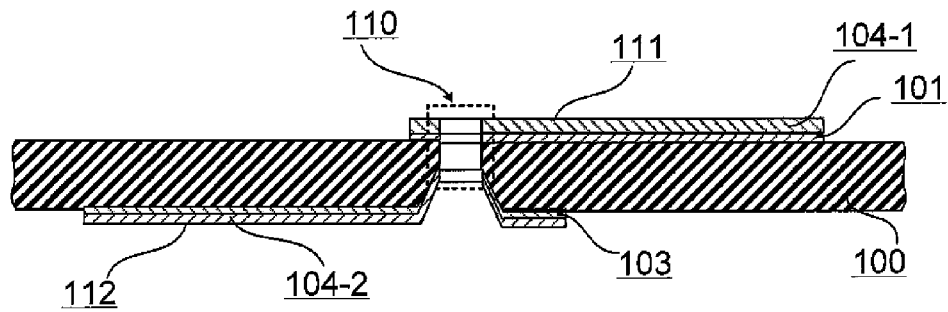
FIG. 18B is a sectional view 18A-18A from FIG. 18A showing the structure of the MIM TD and its connection to the dipoles strips.

The present invention applies industrially particularly for manufacturing of the devices for both converting light power into electric power and reception of terahertz, infrared, and optical radiation as well as for terahertz, infrared, and optical radiation generation by applying an external current. With reference to FIG. 17 through FIG. 19, a rectifying antenna and method of manufacturing the same is provided wherein the assembly comprising of an antenna (microstrip patch antenna (MPA) 108-MPA in FIG. 17, or dipole antenna (DA) 108-DA in FIG. 18, or microstrip slot antenna (MSA) 108-MSA in FIG. 19), which is designed to receive incident electromagnetic radiation 120-IN and provides an induced voltage, and the present invention quasi-planar MIM TD 110, which rectifies the induced within the antenna voltage and generates an output electrical signal that is directed to an output 109-M capable to measure the output electrical signal. FIG. 17 through FIG. 19 are also applicable to another type of devices, which is also based on the non-linear properties of a MIM tunneling junction in conjunction with an antenna, namely, an emitter of electromagnetic radiation. Specifically, in the case of a light emitter shown in FIGS. 18A and 18B, it includes input current source 109-S, a MIM tunneling junction 110 having the non-linear electronic properties, and output dipole antenna 108-DA (enclosed in dashed lines). Output antenna 108-DA consists of metal strips (antenna arms) 111 and 112, which are made using photolithography processing, one on each side of the substrate-slab 100, connected by the present invention quasi-planar MIM tunneling junction 110 that is configured to energize electrons within the tunneling gap by applied input voltage from the input source 109-S. The energized electrons can spontaneously lose their energy by emitting surface plasmons, which are directed toward output antenna where they are coupled out as incoherent broadband output electromagnetic radiation 120-OUT.

The material for the substrate is selected from low dielectric loss materials such as silicon, or germanium, or diamond for infrared frequencies and silicon oxide, $SiO_2$, or silicon nitride, $Si_3N_4$, or diamond for optical frequencies. Photolithography processing is used for antenna topology formation in a designated place of the substrate.

Turning now to FIG. 17, an amplifier/emitter consisted of the MPA and the present invention MIM TD is described. The MPA structure consists of a metal pad 108-MPA on one side of a dielectric sheet-substrate and a continuous metal ground plane 104-G on the other side. The Metal 1 101 coating through the opening in a photoresist layer simultaneously forms both the MPA and electrically connected to it the first MIM tunneling junction electrode within one side of the substrate. Gold or other high conductivity metallization layer 104-1 is deposited over the first Metal 1 coating by a non-lateral method of deposition with normal incidence of vapor flux, which decreases essentially both high series electrical and thermal resistance of the MIM tunneling junction and antenna impedance. The next step includes the first functional metal oxidation or its coating with a nanometer thickness tunneling dielectric followed by the second functional Metal 2 103 layer deposition from the opposite side 100-2 of the substrate 100, which is resulted in formation of the non-planar MIM tunneling junction 110. The fabrication of the antenna/MIMTD assembly is finalized by formation of the metallization 104-2 of the MIM tunneling junction, which simultaneously forms a ground plate 104-G and electrically connects it to the MIM tunneling junction 110. For this design, the MIM tunneling junction position (feed point) must be located at that point on the patch, where the input impedance is 50 ohms for the resonant frequency. Therefore, a trial and error method is most applicable to locate the feed point where the return loss (RL) is the most negative.

FIG. 18A (top view) and FIG. 18B (cross-sectional side view) illustrate yet another embodiment of an amplifier/emitter consisted of a dipole antenna 108-DA (enclosed in dashed lines) and the present invention MIM TD. The dipole antenna structure consists of metal strips (antenna arms) 111 and 112, which are made using photolithography processing, one on each side of the substrate-slab 100, connected by the present invention quasi-planar MIM tunneling junction 110. The Metal 1 103 coating through the opening in a photoresist layer simultaneously forms both one of the antenna arms 112 and electrically connected to it the first MIM tunneling junction electrode within one side of the substrate. Gold or other high conductivity metallization layer 104-2 is deposited over the first Metal 1 coating by a non-lateral method of deposition with normal incidence of vapor flux, which decreases essentially both high series electrical and thermal resistance of the MIM tunneling junction and antenna impedance. The next step includes the first functional Metal 1 oxidation or its coating with a nanometer thickness tunneling dielectric followed by the second functional Metal 2 101 layer deposition through the opening in a photoresist layer, which simultaneously forms both the other antenna arms 111 and electrically connected to it the second MIM tunneling junction electrode on the opposite side of the substrate 100. The fabrication of the antenna/MIMTD assembly is finalized by formation of the metallization 104-1 on both the MIM tunneling junction Metal 2 electrode and the second antenna arm 111.

Figure 19A:
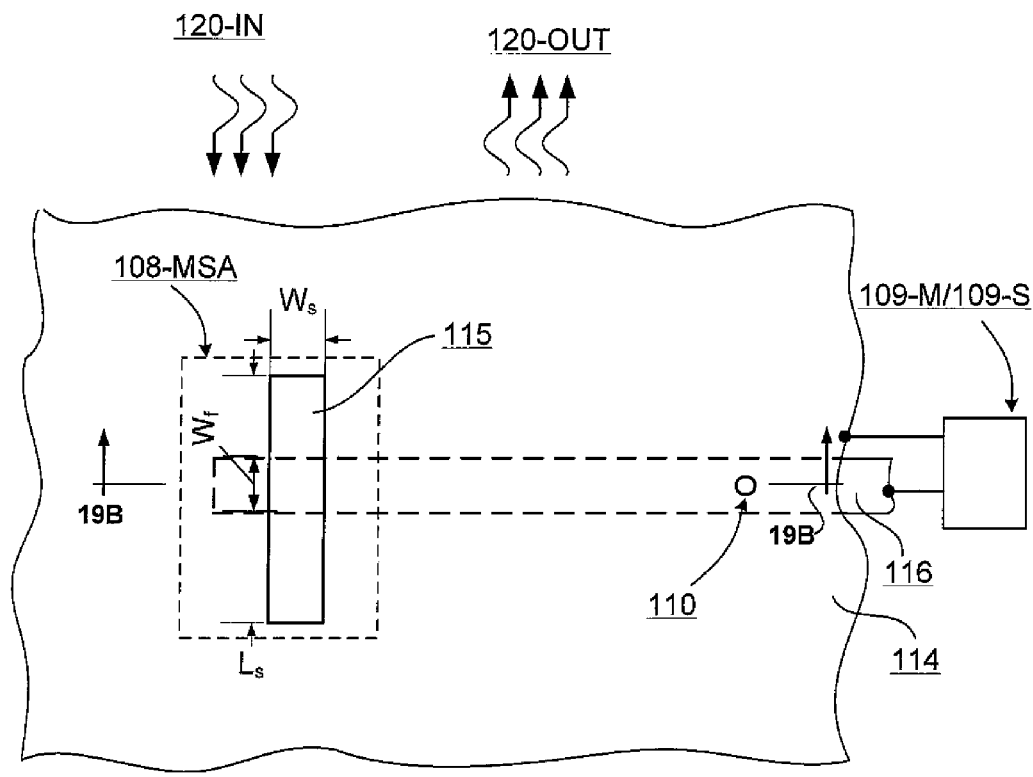
FIG. 19A is a top view of an amplifier/emitter comprising of a microstrip slot antenna and fed by a microstrip line on the opposite side of the, which are connected by the present invention non-planar MIM TD.
Figure 19B:
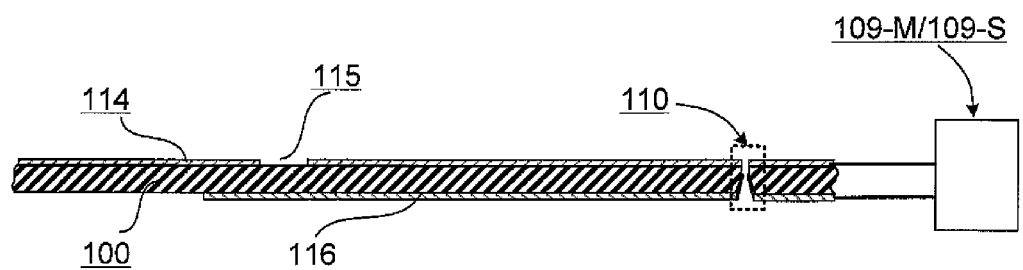
FIG. 19B is a sectional view 19A-19A from FIG. 19A showing the structure of the MIM TD and its connection to the microstrip line.

Still another possible modification to the amplifier embodiment of present invention is illustrated in FIGS. 19A-19B wherein the amplifier/emitter assembly consists of a microstrip slot antenna 108-MSA, which is made as a rectangular slot in the metal ground plate 114 located on one side of the sheet-substrate 100 and fed by a microstrip line 116 on the opposite side of the sheet-substrate, which are connected by the present invention non-planar MIM tunneling junction 110. The slot is etched in the microstrip ground plane using photolithography processing. A microstrip line is run over the slot. The width $W_S$ and length $L_S$ of the slot as well as positioning the microstrip line in the relation to the slot is used for tuning the rectenna assembly.

Turning now to FIGS. 20A-20C, a MIM TD dipole antenna array designed in accordance with the present invention, shown here as an example of the MIM TD antenna array configuration wherein the MIM tunneling junction of each dipole antenna element of the antenna array are connected in series through the antenna arms by using non-planar metal interconnectors.

Specifically, each of the antenna array elements (dipole, bow-tie, microstrip) consists of two metal strips (antenna arms) 111 and 112, which are made using photolithography processing, one on each side of the substrate-slab 100, connected by the present invention non-planar MIM tunneling junction 110 located in the area overlapped by the ends of the antenna arms, as it is seen in FIG. 20C. In turn, each antenna array element is connected in series by a non-planar interconnector located in the area overlapped by a bottom antenna arm 112 of an antenna array element and a top antenna arm 111 of another neighboring antenna array element. As it is shown in FIG. 20B, the intermediate surface for each of the MIM tunneling junctions of an antenna array element is selected from the hole shapes, which are a combination of both conical/pyramidal and cylindrical/prismatic holes adjacent to each other, whereas the intermediate surface for each of the interconnectors between antenna array elements is selected from the conical/prismatic hole shapes. Referring to FIG. 20B, the Metal 1 103 coating through the opening in a photoresist layer simultaneously forms both one of the antenna arms 112 of each antenna array element and the electrical connection to the first electrode of each of both MIM tunneling junction and interconnector within one side of the substrate. Gold or other high conductivity metallization layer 104-2 is deposited over the Metal 1 coating by an I-PVD with a very low incidence collimation angle (less than 5 degree) method of deposition with normal incidence of vapor flux, which results in the partial coverage of the lateral Metal 1 coating within the interconnection of the cylindrical/prismatic and conical/pyramidal surfaces of the MIM tunneling devices as well as complete Metal 1 coverage within the interconnector electrodes. The next step includes the first functional Metal 1 oxidation or its coating with a nanometer thickness tunneling dielectric followed by the second functional Metal 2 101 layer deposition through the opening in a photoresist layer, which simultaneously forms both the other antenna arms 111 of each antenna array element and the electrical connection to the second electrode of each of both MIM tunneling junction and interconnector within the other side of the substrate. The fabrication of the antenna/MIMTD assembly is finalized by formation of the metallization 104-1 on both the MIM tunneling junction Metal 2 electrode and the second antenna arm 111 as well as the ohmic connection between the first and second metallization layers through the thickness of the second functional metal Metal 2 layer, as it is seen in FIG. 20D.

Referring to FIGS. 17-20, the dc lead/leads 109 connect the antenna to the biasing and read-out circuit 109-M or current source 109-S. However, the dc leads also collect some electromagnetic radiation and thus reduce the overall antenna polarization ratio [22]. To eliminate this problem, the width of the dc line 109 needs to be significantly smaller than the width of the antenna or low-pass filter should be applied.

In all the following examples applicable to the described above embodiments, h=3 nm, $\in$=5.7 for NiO used as a tunneling dielectric, and both Metal 1 and Metal 2 electrodes are made of nickel (Ni) having resistivity $\rho=\rho_{Ni}=2.0\cdot10^{-7}$ Ohm·m [23].

Example 1 provides estimation of cut-off frequency of the present invention embodiment illustrated in FIGS. 7A-7B. In this configuration, a silicon planar sheet-substrate of thickness t=800 nm having a hole, which combines a cylindrical area of diameter d=500 nm and height $H_S$=50 nm with a conical one, thus connecting the first and second surfaces of the substrate. Taking antenna radiation resistance, $R_A$, at the feed point of about 50 Ohms and neglecting the series resistance of the MIM TD antenna connection and assuming $H_{G1}$=20 nm, $H_{M1}$=20 nm, and $H_{M1L}$=10 nm for evaluation of the MIM tunneling junction area using Equation 1, one can get, implementing Equation 3, cutoff frequency $\gamma_c$=1.2 THz.

Example 2 provides evaluation of the optimal design limitations on both the resistivity, $\rho$, for the functional metal, Metal 1, and the cylindrical hole diameter, d, in the present invention embodiments illustrated in FIGS. 11A-14B.
1) Operating frequency—28 THz (infrared). In this configurations, a silicon planar sheet-substrate of thickness t=800 nm having a hole, which consists of conical and cylindrical parts with the cylindrical of the diameter d and height $H_S$=200 nm, thus connecting the first and second surfaces of the substrate.
    a) Assuming $H_{TD}$=3 nm, typical for MIM tunneling junctions, and $\in$=5.7 for NiO tunneling dielectric, and using Equation 19, one can get $\rho\leq1.7\cdot10^{-6}$
    b) Assuming $R_A$=50 Ohms, $H_{TD}$=3 nm, $\in$=5.7 for NiO, both Metal 1 and Metal 2 electrodes are made of nickel (Ni) having resistivity $\rho=\rho_{Ni}=2.0\cdot10^{-7}$ Ohm·m [24], and using Equation 20, one can get the optimized capacitance value as low as $1.1\cdot10^{-16}$ m² and the highest allowable values of d≤420 nm and W≤1300 nm for the optimal design of the MIM TD in accordance with FIGS. 11A-12C and FIGS. 13A-14B, respectively, which implies the feasibility of the MIM TD fabrication using conventional optical photolithography processing.
2) Operating frequency—500 THz (visible light). In this configurations, a silicon oxide planar sheet-substrate of thickness t=50 nm having a cylindrical hole of the diameter d (height $H_S$=50 nm), thus connecting the first and second surfaces of the substrate.
    a) Assuming $H_{TD}$=3 nm, and $\in$=5.7 for NiO, and using Equation 19, one can get $\rho\leq1.9\cdot10^{-7}$
    b) Assuming $R_A$=20 Ohms, $H_{TD}$=3 nm, $\in$=5.7 for NiO, both Metal 1 and Metal 2 electrodes are made of nickel (Ni) having resistivity $\rho=\rho_{Ni}=2.0\cdot10^{-7}$ Ohm·m, and using Equation 20, one can get the optimized capacitance value as low as $1.5\cdot10^{-17}$ m² and the highest allowable values of d≤50 nm and W≤150 nm for the optimal design of the MIM TD in accordance with FIGS. 11A-12C and FIGS. 13A-14B, respectively. Fabrication of the feature of such dimensions is a challenge for the contemporary level of the microelectronics technology. However, nanoholes can be made using unconventional technological processing (particularly, by using porosity-based techniques). The following steps of the MIM TD formation are free from nanolithography processing, which implies the feasibility of the implementation of the present invention.

Example 3 provides evaluation of the optimal designs for both 28 THz and 500 THz in the present invention embodiments illustrated in FIGS. 15A-15B.

1) Operating frequency—28 THz (infrared). In this configurations, a silicon planar sheet-substrate of thickness t=800 nm having a hole, which consists of conical and cylindrical parts with the cylindrical of the diameter d and height $H_S$=200 nm, thus connecting the first and second surfaces of the substrate.
   a) Assuming D/d=6, $h_{TD}$=3 nm, typical for MIM tunneling junctions, and $\in$=5.7 for NiO tunneling dielectric, Metal 1 electrodes is made of nickel (Ni) having resistivity $\rho=\rho_{Ni}$=2.0·10$^{-7}$ Ohm·m and using Equation 24, one can get that inequality Equation 19 is valid for any d≤940 nm.
   b) Assuming $R_A$=50 Ohms and using Equation 25, one can get the optimized capacitance value as low as 1·10$^{-16}$ m$^2$ and the highest allowable values of d≤300 nm for the optimal design of the MIM TD in accordance, which implies the feasibility of the MIM TD fabrication using conventional optical photolithography processing.
2) Operating frequency—500 THz (visible light). In this configurations, a silicon oxide planar sheet-substrate of thickness t=50 nm having a cylindrical hole of the diameter d (height $H_S$=50 nm), thus connecting the first and second surfaces of the substrate.
   a) Assuming D/d=10, $h_{TD}$=3 nm, typical for MIM tunneling junctions, and $\in$=5.7 for NiO tunneling dielectric, Metal 1 electrodes is made of nickel (Ni) having resistivity $\rho=\rho_{Ni}$=2.0·10$^{-7}$ Ohm·m and using Equation 24, one can get that inequality Equation 19 is valid for any d≤41 nm.
   b) Assuming $R_A$=50 Ohms and using Equation 25, one can get the optimized capacitance value as low as 1·10$^{-17}$ m$^2$ and the highest allowable values of d≤30 nm for the optimal design. Fabrication of the feature of such dimensions is a challenge for the contemporary level of the microelectronics technology. However, nanoholes can be made using unconventional technological processing (particularly, by using porosity-based techniques). The following steps of the MIM TD formation are free from nanolithography processing, which implies the feasibility of the implementation of the present invention.

From the above-descriptive materials it may be readily understood that the present invention is a non-planar metal-insulator-metal tunneling diode. First provided is a planar sheet-substrate chosen from a group comprising semiconductors and dielectrics. The sheet-substrate has a first planar surface and a second planar surface. The first and second planar surfaces constitute first and second planar surfaces.

The sheet-substrate has an intermediate surface extending between and connecting the first and second planar surfaces. The intermediate surface in the sheet-substrate is selected from a group comprising holes, slits and side edges.

The intermediate surface is constructed by such a way that it or its portion is exposed by the sources of particulate material generation located from both the first and the secondsides of the sheet-substrate.

The location and size of the mutually exposed from the both particulate material sources area depends of the methods and geometry of the deposition.

The intermediate surfaces formed by a hole are distinguished by four basic hole shapes:
   a) Cylindrical/prismatic intermediate surface
   b) Conical/pyramidal intermediate surface
   c) A combination of conical/pyramidal surface from one side and a cylindrical/prismatic surface from the other side
   d) A combination of conical/pyramidal surfaces from both first and second sides of the sheet-substrate and a cylindrical/prismatic surface in a middle portion of the hole.

The invention aspects are not to be limited to the basic schematics and shapes described above.

Because of percolative behavior of ultrathin metal films, the thickness of the functional layers and the metallization layers should not be lower than 6 nm.

A tunneling dielectric layer is provided on the intermediate surface. The tunneling dielectric layer ranges in thickness from 1 nm to 5 nm.

The tunneling oxide layer is selected from the group of native oxides of the first deposited functional metal or can be made using advanced methods such as ALD.

Multilayer tunneling dielectric structures suitable for tunneling may be used instead of the single layer tunneling dielectric structure.

Dielectric structures can be prepared using a combination of different methods, particularly, oxidation of the first functional metal can be followed by ALD or other methods of dielectric layer formation.

A second Metal 2 layer over the tunneling oxide layer provides a metal-insulator-metal tunneling diode junction formation.

The first and second metal layers are formed of the same metal. Alternatively, the first and second metal layers are formed of metals having different work functions.

The first and second metals are selected but not limited to transition metals or metal alloys possessing high density states in the region of free and occupied electron states, namely, nickel, cobalt, molybdenum, manganese, iron, tungsten, niobium, platinum and others.

In addition, from the above-descriptive materials it may be readily understood that the present invention is also a method of non-planar metal-insulator-metal tunneling diode formation.

The first step in the method is providing a sheet-substrate with first and second planar surfaces and with an intermediate surface extending between and connecting the first and second planar surfaces.

The next step of the method is initially forming Metal 1 layer coating, which is accompanied by metallization, on the top planar surface and on the intermediate surface of the substrate. Both Metal 1 layer and metallization can be formed on the substrate surface as the first step of the fabrication in two alternate methods.

The next step of the method is forming a tunneling dielectric layer or multilayer coating on the intermediate surface. The final step of the method is subsequently forming a Metal 2 layer coating, which is accompanied by metallization, on the bottom planar surface and on the intermediate surface of the substrate. A second Metal 2 layer over the tunneling oxide layer provides a metal-insulator-metal tunneling diode junction formation. Both Metal 2 layer and metallization can be formed on the substrate surface as the last step of the fabrication in two alternate methods.

Secondly, from the above-descriptive materials, it may be readily understood that the present invention is also a detector device for detecting incident electromagnetic radiation. In these detectors, a planar sheet-substrate made of low dielectric loss sheet material such as silicon or germanium or arsenide gallium for infrared or such as quartz and sapphire for visible or near infrared having the first and the second sheet side constituting first and second sheet surfaces and an intermediate surface in the form of a hole, which extends between and connects the first and second surfaces of the substrate.

First provided is a microstrip patch antenna for receiving input electromagnetic radiation, which is located on the first side of the sheet-substrate. Further, a ground plate made of metal is provided on the second side of the sheet-substrate. Further, the microstrip patch antenna and the ground plate are coupled by the metal layers of the metal-insulator-metal tunneling diode.

Next provided is a non-planar metal-insulator-metal tunneling diode structure that is electrically connected between the antenna and ground and rectifies induced electromagnetic oscillations within the metal electrodes.

Next provided is an output connected to the MIM TD for monitoring useful electrical signals.

In another embodiment of the detector device, first provided is a dipole antenna with a first arm and a second arm. The first arm is on the first side of the sheet-substrate. The second arm is on the second side of the sheet-substrate.

Next provided is a non-planar metal-insulator-metal tunneling diode structure that is electrically connected between the first and second antenna arms and rectifies induced electromagnetic oscillations within the antenna arms.

The first and second parts of the dipole antenna are coupled by the metal layers of the metal-insulator-metal tunneling diode.

Next provided is an output connected to the MIM TD for monitoring useful electrical signals.

In yet another embodiment of the detector device, the antenna is a microstrip slot antenna having a metal ground plate with a slot. The ground plate is on the first side of the sheet-substrate. The microstrip slot antenna has a microstrip line on the second side of the sheet-substrate. The ground plate and the microstrip line of the microstrip slot antenna are coupled by the metal layers of the metal-insulator-metal tunneling diode.

Lastly, the MIM TD of present invention, which configured in a way to produce nonlinear V-I characteristic, can be used not only for sensing but also for generation of terahertz/infrared/optical radiation.

In an embodiment of a light emitter designed in accordance with the present invention MIM TD, first provided is an input current source connected to a MIM tunneling junction of the present invention, which has non-linear electronic properties.

Second provided is an output antenna. Output antenna consists of metal strips (antenna arms), which are made using photolithography processing, one on each side of the substrate-slab, connected by the present invention quasi-planar MIM TD that is configured to energize electrons within the tunneling gap by applied input voltage from the input source. The energized electrons can spontaneously lose their energy by emitting surface plasmons, which are directed toward output antenna where they are coupled out as incoherent broadband output electromagnetic radiation.

The present examples and descriptions should be considered as illustrative and not restrictive, and the invention is not to be limited to the details given herein but may be modified within the scope of the appended claims. Particularly, the MIM TD of present invention in a combination with antenna or arrays of such assemblies can be used for the direct conversion of infrared and even visible light energy into electrical power by direct rectification of ultrahigh frequency electromagnetic wave.

What is claimed is:

1. A non-planar metal-insulator-metal tunneling device comprising:
    a sheet-substrate chosen from a group comprising semiconductors and dielectrics;
    the sheet-substrate having a smooth first planar surface and a smooth second planar surface;
    the sheet-substrate having an intermediate smooth surface extending between and connecting the first and second planar surfaces;
    the intermediate surface being selected from a group comprising holes, slits and side edges;
    the intermediate surface having a common area that is exposed by sources of particulate material generation located from both the first and second planar surfaces of the sheet-substrate;
    a first functional metal layer on the first and intermediate surfaces including the common area;
    a tunneling dielectric layer over the first functional metal layer within the common area of the intermediate surface;
    a second functional metal layer on the second and intermediate surfaces including the common area over the tunneling dielectric layer thus providing a metal-insulator-metal tunneling junction within the common area of the intermediate surface; and
    secondary metallization layers adjacent to both the first and second functional metal layers without direct contact with each other within the device.

2. The non-planar metal-insulator-metal tunneling device as set forth in claim 1 wherein the non-planar metal-insulator-metal tunneling device posses both internal capacitance of the metal-insulator-metal tunneling junction and resistance of the device connectors, which are mutually dependent through the geometrical configuration of the device.

3. The non-planar metal-insulator-metal tunneling device as set forth in claim 2 wherein the first and second functional metal layers are continuous and the thickness of both the first and second functional metal layers is above their percolative threshold which at least 6 nm.

4. The non-planar metal-insulator-metal tunneling device as set forth in claim 3 wherein at least one metallization layer is positioned immediately next to the metal-insulator-metal tunneling junction area.

5. The non-planar metal-insulator-metal tunneling device as set forth in claim 4 wherein the non-planar metal-insulator-metal tunneling device is an optimized device selected from the group of device configurations having reactive resistance equal to the sum of the real part of the external embedding circuit impedance and the internal device resistance.

6. The optimized non-planar metal-insulator-metal tunneling device as set forth in claim 5 wherein the electrode geometry factor, which is a function of a combination of geometric parameters of the metal-insulator-metal tunneling device, is less than the ratio of the critical resistivity parameter, which is reversely proportional to the product of the operating frequency and dielectric constant of the tunneling dielectric, to the resistivity of the first functional metal layer.

7. The optimized non-planar metal-insulator-metal tunneling device as set forth in claim 6 wherein a junction-length factor, which is defined as the tunneling junction length normalized by the thickness of the tunneling dielectric of the junction, is less than the difference of the critical resistivity parameter and the product of the resistivity of the first functional metal layer and the electrode geometry factor, which is normalized by the product of the real part of the external embedding circuit impedance and percolative threshold thickness of the first functional metal layer.

8. The non-planar metal-insulator-metal tunneling device as set forth in claim 1 wherein the intermediate surface of the sheet-substrate is a hole.

9. The non-planar metal-insulator-metal tunneling device as set forth in claim 8 wherein the hole is selected from the group of shapes including cylindrical/prismatic, conical/pyramidal, a combination of conical/pyramidal and cylindrical/prismatic, and a combination of two conical/pyramidal on sides and cylindrical/prismatic in a middle portion of the hole.

10. The non-planar metal-insulator-metal tunneling device as set forth in claim 9 wherein the hole is a combination of both conical/pyramidal and cylindrical/prismatic holes adjacent to each other and the cylindrical/prismatic portion of the hole has an aspect ratio up to 5.

11. The non-planar metal-insulator-metal tunneling device as set forth in claim 10 wherein the metal-insulator-metal tunneling junction is located on a surface within the cylindrical/prismatic portion of the hole and its area is defined by the surface of the cylinder comprising the height of the cylindrical/prismatic portion of the hole and the thickness of both first deposited functional metal and metallization layers and the length in the order of the perimeter of the cylindrical/prismatic portion of the hole, wherein metallization layers of both functional metal layers are positioned immediately next to the metal-insulator-metal tunneling junction area.

12. The non-planar metal-insulator-metal tunneling device as set forth in claim 11 wherein the metal-insulator-metal tunneling junction is located within a portion of the side wall along the cylindrical/prismatic portion of the hole.

13. The non-planar metal-insulator-metal tunneling device as set forth in claim 10 wherein the metal-insulator-metal tunneling junction is located within the cylindrical/prismatic portion of the hole along a line of an intersection of the conic/pyramidal and cylindrical/prismatic surfaces of the hole and its area is defined by the width in the order of a lateral thickness of the first planar functional metal layer located on the cylindrical/prismatic portion of the hole and a length in the order of the perimeter of the cylindrical/prismatic portion of the hole, wherein the electrode-geometry-factor is the height of the cylindrical/prismatic portion of the hole coated only by the first functional metal, which is normalized by the thickness of the tunneling dielectric of the metal-insulator-metal tunneling junction.

14. The non-planar metal-insulator-metal tunneling device as set forth in claim 10 wherein the metal-insulator-metal tunneling junction is located within the cylindrical/prismatic portion of the hole along the line of an intersection of the first planar and cylindrical/prismatic surfaces of the hole and its area is defined by the width in the order of a lateral thickness of the first functional metal layer located on the side wall of the cylindrical/prismatic portion of the hole and the length in the order of the perimeter of the cylindrical/prismatic portion of the hole, wherein the electrode-geometry-factor is the height of the cylindrical/prismatic portion of the hole coated only by the first functional metal, which is normalized by the thickness of the tunneling dielectric of the metal-insulator-metal tunneling junction.

15. The non-planar metal-insulator-metal tunneling device as set forth in claim 10 wherein the metal-insulator-metal tunneling junction is located within the cylindrical/prismatic portion of the hole along the line of an intersection of the first planar and cylindrical/prismatic surfaces of the hole and its area is defined by a width in the order of the thickness of the first functional metal layer located on the planar surface of the substrate and the length in the order of the perimeter of the cylindrical/prismatic portion of the hole, wherein the planar surface around the tunneling junction location outside of the defined distance has an additional layer of the metallization and inside is coated only by the first functional metal layer and in the case of the cylindrical shape, the electrode-geometry-factor of this configuration is a half of the product of the hole diameter on the logarithm of the ratio of external metallization diameter to the hole diameter, which is normalized by the thickness of the tunneling dielectric of the metal-insulator-metal tunneling junction.

\* \* \* \* \*